US012191836B2

(12) United States Patent
Jeong

(10) Patent No.: US 12,191,836 B2
(45) Date of Patent: Jan. 7, 2025

(54) BANDPASS FILTER, TOUCH DRIVER INCLUDING THE SAME, AND METHOD OF BANDPASS FILTERING

(71) Applicant: SAMSUNG DISPLAY CO., LTD., Yongin-si (KR)

(72) Inventor: Moon Jae Jeong, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 114 days.

(21) Appl. No.: 17/818,442

(22) Filed: Aug. 9, 2022

(65) Prior Publication Data

US 2023/0121263 A1  Apr. 20, 2023

(30) Foreign Application Priority Data

Oct. 20, 2021 (KR) .......................... 10-2021-0140003

(51) Int. Cl.
*H03H 7/12* (2006.01)
*G06F 3/041* (2006.01)

(52) U.S. Cl.
CPC ........... *H03H 7/12* (2013.01); *G06F 3/04182* (2019.05)

(58) Field of Classification Search
CPC .......... H03H 7/12; H03H 7/0161; H03H 7/00; H03H 2007/0192; G06F 3/04182
USPC .................................. 327/551, 552, 554, 557
See application file for complete search history.

(56) References Cited

U.S. PATENT DOCUMENTS

| 9,014,653 | B2 | 4/2015 | Madadi et al. |
| 9,136,815 | B2* | 9/2015 | Aggarwal ................ H03H 7/12 |
| 10,146,379 | B2* | 12/2018 | Wang .................... G06F 3/0412 |
| 2013/0335163 | A1 | 12/2013 | Aggarwal et al. |
| 2014/0080436 | A1 | 3/2014 | Madadi et al. |
| 2015/0133068 | A1 | 5/2015 | Aggarwal et al. |
| 2019/0215030 | A1 | 7/2019 | Nabki et al. |
| 2020/0119766 | A1 | 4/2020 | Nabki et al. |
| 2020/0358474 | A1 | 11/2020 | Nabki et al. |

(Continued)

FOREIGN PATENT DOCUMENTS

| EP | 2871774 | 5/2015 |
| WO | 9807127 | 2/1998 |

(Continued)

OTHER PUBLICATIONS

Partial European Search Report dated Mar. 22, 2023 in corresponding European Patent Application No. 22202605.6 (18 pages).

(Continued)

*Primary Examiner* — Hai L Nguyen
(74) *Attorney, Agent, or Firm* — F. CHAU & ASSOCIATES, LLC

(57) ABSTRACT

A bandpass filter comprises first and second input terminals configured to receive a plurality of radio frequency signals having a phase difference, first and second load resistors connected in series to the first and second input terminals, respectively, a first switching unit connected in series to the first and second load resistors, a capacitor unit connected in series to the first switching unit, a second switching unit connected between the capacitor unit and a ground, and first and second output terminals connected between the first switching unit and the first and second load resistors, respectively.

21 Claims, 11 Drawing Sheets

(56) References Cited

U.S. PATENT DOCUMENTS

| | | | |
|---|---|---|---|
| 2021/0203379 A1 | 7/2021 | Nabki et al. | |
| 2022/0337285 A1 | 10/2022 | Nabki et al. | |

FOREIGN PATENT DOCUMENTS

| | | |
|---|---|---|
| WO | 2019-000075 | 1/2019 |
| WO | 2019211997 | 7/2019 |

OTHER PUBLICATIONS

Mirzaei, et al., "A Low-Power Process-Scalable Super-Heterodyne Receiver With Integrated High-Q Filters", IEEE Journal of Solid-State Circuits, vol. 46. No. 12, Dec. 2011, pp. 2920-2932.

Ghaffari, et al., "Tunable High-Q N-Path Band-Pass Filters: Modeling and Verification", IEEE Journal of Solid-State Circuits, vol. 46, No. 5, May 2011, pp. 998-1010.

Tohidian, et al., "A 2mW 800MS/s 7th-Order Discrete-Time IIR Filter with 400kHz-to-30MHz BW and 100dB Stop-Band Rejection in 65nm CMOS", 2013 IEEE International Solid-State Circuits Conference, Session 10, Analog Techniques, 10.2, 3 pages.

Madadi, et al., "A 65nm CMOS High-IF Superheterodyne Receiver with a High-Q Complex BPF", 2013 IEEE Radio Frequency Integrated Circuits Symposium, pp. 323-326.

Tohidian, et al., "A Fully Integrated Discrete-Time Superheterodyne Receiver", IEEE Transactions on Very Large Scale Integration (VLSI) Systems, vol. 25, No. 2, Feb. 2017, pp. 635-647.

Tohidian, et al., "A Fully Integrated Highly Reconfigurable Discrete-Time Super-Heterodyne Receiver" 2014 IEEE International Solid-State Circuits Conference, Session 3, RF Techniques, 3 pages.

Madadi, et al., "High IIP2 SAW-Less Superheterodyne Receiver With Multistage Harmonic Rejection", IEEE Journal of Solid-State Circuits, vol. 51, No. 2, Feb. 2016, pp. 332-347.

Madadi, et al., "A TDD FDD SAW-less superheterodyne receiver with blocker-resilient band-pass filter and multi-stage HR in 28nm CMOS", 2015 Symposium on VLSI Circuits Digest of Technical Papers, pp. C308-C309.

Tohidian, et al., "Analysis and Design of a High-Order Discrete-Time Passive IIR Low-Pass Filter", IEEE Journal of Solid-State Circuits, vol. 49, No. 11, Nov. 2014, pp. 2575-2587.

Madadi, et al., "Analysis and Design of I/Q Charge-Sharing Band-Pass-Filter for Superheterodyne Receivers", IEEE Transactions on Circuits and Systems-I: Regular Papers, vol. 62, No. 8, Aug. 2015, pp. 2114-2121.

\* cited by examiner

BANDPASS FILTER, TOUCH DRIVER INCLUDING THE SAME, AND METHOD OF BANDPASS FILTERING

CROSS-REFERENCE TO RELATED APPLICATION

This application claims priority from Korean Patent Application No. 10-2021-0140003 filed on Oct. 20, 2021, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a complex bandpass filter and a touch driver including the same.

2. Description of the Related Art

In signal processing, a filter may include a circuit or device (e.g., a two-port circuit or device) that removes frequency components of a signal (e.g., an alternating voltage or current). Analog filters may be used as low pass, bandpass, or high pass filters in various applications. A bandpass filter allows through components of a signal that are within a specified band of frequencies (e.g., components of a signal within a configured passband), while filtering out (e.g., or blocking) components of the signal with frequencies above or below the passband.

For instance, in wireless communications systems, a receiver (e.g., a receiving device) may use an analog filter to select (e.g., filter) a signal region and remove noise from a signal (e.g., a signal demodulated to a baseband signal by a mixer of the receiving device). The analog filter may improve performance of a device or a system by precisely filtering a target frequency band (e.g., by precisely filtering a target frequency band configured for communications within the wireless communications system).

In some aspects, the receiver may selectively pass a positive frequency component or a negative frequency component of a radio frequency signal, using a complex bandpass filter. Conventionally, complex bandpass filters may require a tuning circuit that increases the area of the receiver and mitigates characteristic variations. In addition, operation of complex bandpass filters may demand significant resources (e.g., such as hardware area, high power consumption, etc.).

SUMMARY

Aspects of the present disclosure provide a bandpass filter (e.g., a complex bandpass filter) capable of realizing a small area and low power, removing a direct current (DC) offset, and removing a high-order harmonic component of an output while having a high quality factor, and also provide a touch driver including this complex bandpass filter.

However, aspects of the present disclosure are not restricted to the examples set forth herein. The above and other aspects of the present disclosure will become more apparent to one of ordinary skill in the art to which the present disclosure pertains by referencing the detailed description of the present disclosure given below.

According to an embodiment of the disclosure, a bandpass filter comprises a first input terminal and a second input terminal, the first input terminal and the second input terminal configured to receive a plurality of radio frequency signals having a phase difference, a first load resistor connected in series to the first input terminal, a second load resistor connected in series to the second input terminal, a first switching unit connected in series to the first load resistor and the second load, a capacitor unit connected in series to the first switching unit, a second switching unit connected between the capacitor unit and a ground, a first output terminal connected between the first switching unit and the first load resistor, and second output terminal connected between the first switching unit and the second load resistor.

The first switching unit and the second switching unit may be turned on based on clock signals having the same phase to connect the first load resistor and the capacitor unit in series to the ground or to connect the second load resistor and the capacitor unit in series to the ground.

One switching element of the first switching unit and one switching element of the second switching unit may be turned on based on a clock signal having a first phase, and may be connected to one capacitor of the capacitor unit. Another switching element of the first switching unit and another switching element of the second switching unit may be turned on based on the clock signal having the first phase, and may be connected to another capacitor of the capacitor unit.

The first switching unit may comprise at least one first-first switching element turned on based on a first clock signal having a first phase, at least one first-second switching element turned on based on a second clock signal having a second phase delayed from the first phase, at least one first-third switching element turned on based on a third clock signal having a third phase delayed from the second phase, and at least one first-fourth switching element turned on based on a fourth clock signal having a fourth phase delayed from the third phase.

The capacitor unit may comprise a first capacitor connected to the first load resistor through the at least one first-first switching element, and the first capacitor is connected to the second load resistor through the at least one first-third switching element; a second capacitor connected to the first load resistor through the at least one first-second switching element, and the second capacitor is connected to the second load resistor through the at least one first-fourth switching element; a third capacitor connected to the first load resistor through the at least one first-third switching element, and the third capacitor is connected to the second load resistor through the at least one first-first switching element; and a fourth capacitor connected to the first load resistor through the at least one first-fourth switching element, and the fourth capacitor is connected to the second load resistor through the at least one first-second switching element.

The second switching unit may comprise at least one second-first switching element turned on based on the first clock signal having the first phase, at least one second-second switching element turned on based on the second clock signal having the second phase delayed from the first phase, at least one second-third switching element turned on based on the third clock signal having the third phase delayed from the second phase, and at least one second-fourth switching element turned on based on the fourth clock signal having the fourth phase delayed from the third phase.

The first capacitor may be connected to the ground through the second-first switching element or the second-third switching element. The second capacitor may be connected to the ground through the second-second switching element or the second-fourth switching element. The third capacitor may be connected to the ground through the second-third switching element or the second-first switching element. The fourth capacitor may be connected to the ground through the second-fourth switching element or the second-second switching element.

The bandpass filter may further comprise a third input terminal and a fourth input terminal configured to receive a plurality of radio frequency signals having a phase different from those of the radio frequency signals of the first and second input terminals, a third load resistor connected to the third input terminal, a fourth load resistor connected to the fourth input terminal, a third switching unit connected between the third load resistor and the capacitor unit or between the fourth load resistor and the capacitor unit, a fourth switching unit connected between the capacitor unit and the ground, a third output terminal connected between the third switching unit and the third load resistor, and a fourth output terminal connected between the third switching unit and the fourth load resistor.

The third switching unit may comprise at least one third-first switching element turned on based on the first clock signal having the first phase, at least one third-second switching element turned on based on the second clock signal having the second phase delayed from the first phase, at least one third-third switching element turned on based on the third clock signal having the third phase delayed from the second phase, and at least one third-fourth switching element turned on based on the fourth clock signal having the fourth phase delayed from the third phase.

The fourth switching unit may comprise at least one fourth-first switching element turned on based on the first clock signal having the first phase, at least one fourth-second switching element turned on based on the second clock signal having the second phase delayed from the first phase, at least one fourth-third switching element turned on based on the third clock signal having the third phase delayed from the second phase, and at least one fourth-fourth switching element turned on based on the fourth clock signal having the fourth phase delayed from the third phase.

The first capacitor may be connected to the third load resistor through the third-second switching element, and the first capacitor is connected to the fourth load resistor through the third-fourth switching element. The second capacitor may be connected to the third load resistor through the third-third switching element, and the second capacitor is connected to the fourth load resistor through the third-first switching element. The third capacitor may be connected to the third load resistor through the third-fourth switching element, and the third capacitor is connected to the fourth load resistor through the third-second switching element. The fourth capacitor may be connected to the third load resistor through the third-first switching element, and the fourth capacitor is connected to the fourth load resistor through the third-third switching element.

The first capacitor may be connected to the ground through the fourth-second switching element or the fourth-fourth switching element. The second capacitor may be connected to the ground through the fourth-third switching element or the fourth-first switching element. The third capacitor may be connected to the ground through the fourth-fourth switching element or the fourth-second switching element. The fourth capacitor may be connected to the ground through the fourth-first switching element or the fourth-third switching element.

The first switching unit may comprise at least one first-first switching element turned on based on a first clock signal having a first phase, at least one first-second switching element turned on based on a second clock signal having a second phase delayed from the first phase, at least one first-third switching element turned on based on a third clock signal having a third phase delayed from the second phase, at least one first-fourth switching element turned on based on a fourth clock signal having a fourth phase delayed from the third phase, at least one first-fifth switching element turned on based on a fifth clock signal having a fifth phase delayed from the fourth phase, at least one first-sixth switching element turned on based on a sixth clock signal having a sixth phase delayed from the fifth phase, at least one first-seventh switching element turned on based on a seventh clock signal having a seventh phase delayed from the sixth phase, and at least one first-eighth switching element turned on based on an eighth clock signal having an eighth phase delayed from the seventh phase.

The capacitor unit may comprise a first capacitor connected to the first load resistor through the at least one first-first switching element, and the first capacitor is connected to the second load resistor through the at least one first-fifth switching element; a second capacitor connected to the first load resistor through the at least one first-second switching element, and the second capacitor is connected to the second load resistor through the at least one first-sixth switching element; a third capacitor connected to the first load resistor through the at least one first-third switching element, and the third capacitor is connected to the second load resistor through the at least one first-seventh switching element; a fourth capacitor connected to the first load resistor through the at least one first-fourth switching element, and the fourth capacitor is connected to the second load resistor through the at least one first-eighth switching element; a fifth capacitor connected to the first load resistor through the at least one first-fifth switching element, and the fifth capacitor is connected to the second load resistor through the at least one first-first switching element; a sixth capacitor connected to the first load resistor through the at least one first-sixth switching element, and the sixth capacitor is connected to the second load resistor through the at least one first-second switching element; a seventh capacitor connected to the first load resistor through the at least one first-seventh switching element, and the seventh capacitor is connected to the second load resistor through the at least one first-third switching element; and an eighth capacitor connected to the first load resistor through the at least one first-eighth switching element, and the eight capacitor is connected to the second load resistor through the at least one first-fourth switching element.

The second switching unit may comprise at least one second-first switching element turned on based on the first clock signal having the first phase, at least one second-second switching element turned on based on the second clock signal having the second phase delayed from the first phase, at least one second-third switching element turned on based on the third clock signal having the third phase delayed from the second phase, at least one second-fourth switching element turned on based on the fourth clock signal having the fourth phase delayed from the third phase, at least one second-fifth switching element turned on based on the fifth clock signal having the fifth phase delayed from the fourth phase, at least one second-sixth switching element turned on based on the sixth clock signal having the sixth phase delayed from the fifth phase, at least one second-seventh switching element turned on based on the seventh clock signal having the seventh phase delayed from the sixth phase, and at least one second-eighth switching element turned on based on the eighth clock signal having the eighth phase delayed from the seventh phase.

The bandpass filter may further comprise third and fourth input terminals configured to receive a second plurality of radio frequency signals having a second phase difference different from the phase difference of the plurality of radio frequency signals the first and second input terminals are configured to receive: a third load resistor connected to the third input terminal, and a fourth load resistor connected to the fourth input terminal, a third switching unit connected between the third load resistor and the capacitor unit or between the fourth load resistor and the capacitor unit, a fourth switching unit connected between the capacitor unit and the ground, a third output terminals connected between the third switching unit and the third load resistor, and a fourth output terminal connected between the third switching unit and the fourth load resistor.

According to an embodiment of the disclosure, a bandpass filter comprises first and second input terminals configured to receive a plurality of radio frequency signals having a phase difference, a first load resistor connected in series to the first input terminal; a second load resistor connected in series to the second input terminal, a first switching unit configured to connect the first load resistor or the second load resistor to each of a plurality of paths, a capacitor unit disposed on each of the plurality of paths and connected to the first switching unit, and a second switching unit disposed on each of the plurality of paths and connected between the capacitor unit and a ground.

The bandpass filter may further comprise a first output terminal connected between the first switching unit and the first load resistor; and a second output terminal connected between the first switching unit and the second load resistor.

A switching element of the first switching unit and a switching element of the second switching unit disposed on one path among the plurality of paths may be turned on based on clock signals having the same phase to connect the first load resistor and the capacitor unit in series to the ground or to connect the second load resistor and the capacitor unit in series to the ground.

According to an embodiment of the disclosure, a touch driver comprises a bandpass filter configured to receive a radio frequency signal and filter a specific frequency band, a first mixer configured to receive an output of the bandpass filter and output frequency signals having a first phase and a second phase opposite to the first phase, a second mixer configured to receive an output of the bandpass filter and output frequency signals having a third phase different from the first phase and a fourth phase opposite to the third phase, and a bandpass filter configured to receive outputs of the first and second mixers and select and output one of a positive frequency component and a negative frequency component. The bandpass filter comprises a first input terminal and a second input terminal, the first input terminal and the second input terminal configured to receive a plurality of radio frequency signals having a phase difference; a first load resistor connected in series to the first input terminal; a second load resistor connected in series to the second input terminal; a first switching unit connected in series to the first load resistor and the second load resistor; a capacitor unit connected in series to the first switching unit; a second switching unit connected between the capacitor unit and a ground; a first output terminal connected between the first switching unit and the first load resistor; and a second output terminal connected between the first switching unit and the second load resistor.

According to an embodiment of the disclosure, a method comprises: receiving a plurality of radio frequency signals using a first input terminal and a second input terminal; selecting one of a positive frequency component and a negative frequency component using: first and second load resistors connected in series to the first and second input terminals, respectively, a first switching unit connected in series to the first and second load resistors, a capacitor unit connected in series to the first switching unit, and a second switching unit connected between the capacitor unit and a ground; and outputting the selected one of the positive frequency component and the negative frequency component using first and second output terminals, the first and second output terminals connected between the first switching unit and the first and second load resistors, respectively.

According to another embodiment of the disclosure, a method comprises: receiving a plurality of radio frequency signals using at least two input terminals; selecting one of a positive frequency component and a negative frequency component using: at least two load resistors connected in series to the at least two input terminals, a first switching unit connected in series to the at least two load resistors, a capacitor unit connected in series to the first switching unit, and a second switching unit connected between the capacitor unit and a ground; and outputting the selected one of the positive frequency component and the negative frequency component using at least two output terminals, the at least two output terminals connected between the first switching unit and the at least two load resistors.

In the bandpass filter and the touch driver including the same according to the described example embodiments, the bandpass filter without having an operational transconductance amplifier (OTA) may be implemented, and, thus, it may be possible to remove a DC offset while realizing a small area and low power without needing to include a separate tuning circuit. The bandpass filter and the touch driver including the same are capable of removing a high-order harmonic component and realizing a high quality factor, thus improving sensitivity and selectivity.

However, the effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
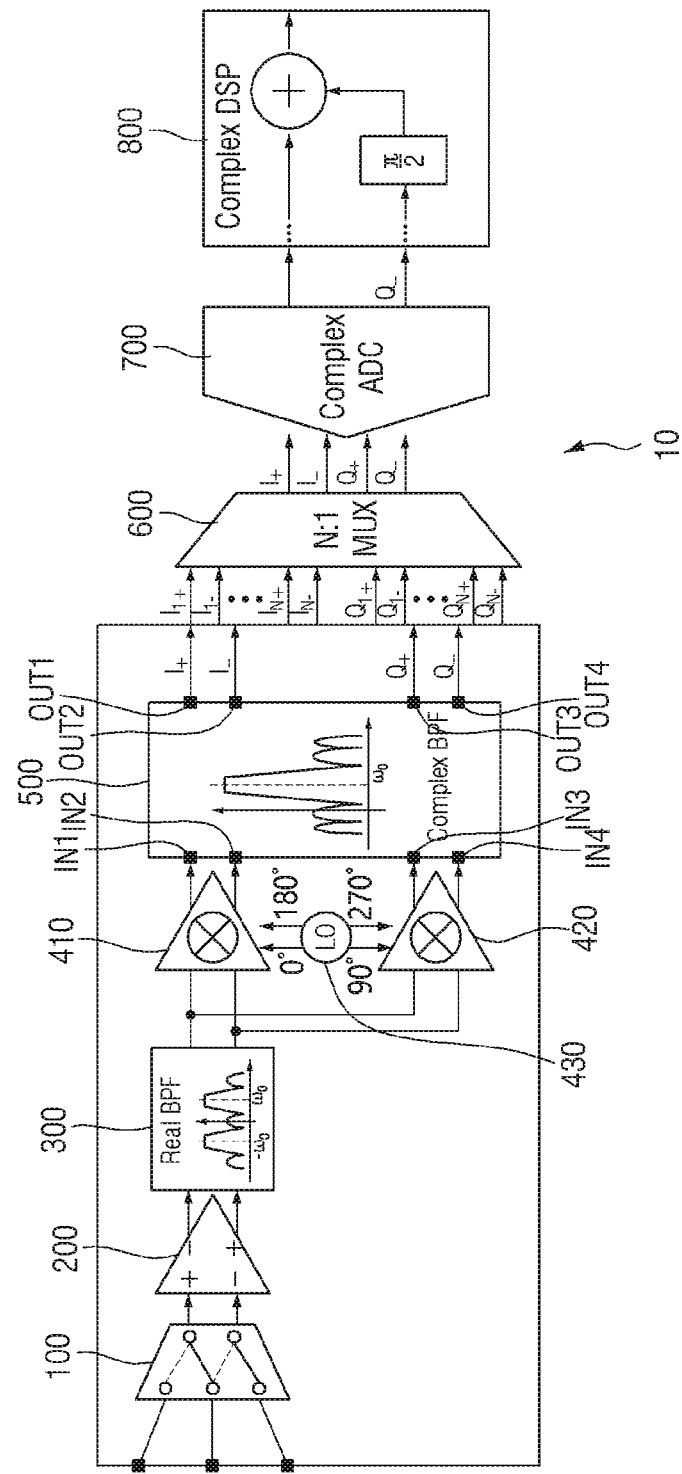
FIG. 1 is a block diagram illustrating a touch driver according to one embodiment.

Integrated circuits may be increasingly specified to have high efficiency, such as a small area and low power consumption, while providing desired performance. Integrated circuits that process analog signals may include multiple amplifiers, thus amplifiers having a small area and low power consumption while providing high performance are preferred. For example, an amplifier for processing an analog signal used for wireless communication requires not only a wide bandwidth, due to a wide channel bandwidth, but also a small area and low power consumption for use in a portable communication device such as a user terminal.

One or more aspects disclosed herein enable complex bandpass filters with improved sensitivity, improved selectivity, and improved fidelity over a wide band. For instance, complex bandpass filters (e.g., and touch drivers including such complex bandpass filters) may not necessarily include an operational transconductance amplifier (OTA) for frequency shifting. A complex notch filter may be implemented using switching elements, load resistors, and capacitors, as described in more detail herein. In some cases, an OTA may include various components (e.g., for frequency shifting), for example, such as a bias current circuit, a transconducting circuit, a current divider, an output circuit, etc. Accordingly, complex bandpass filter designs and techniques described herein may be implemented in a relatively small area with low (e.g., reduced) power consumption, as such OTAs may be omitted. Moreover, the described complex bandpass filters may solve a DC offset problem and may not require an additional tuning circuit (e.g., for alleviating the change in the frequency characteristic).

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

A processor is an intelligent hardware device, (e.g., a general-purpose processing component, a digital signal processor (DSP), a central processing unit (CPU), a graphics processing unit (GPU), a microcontroller, an application specific integrated circuit (ASIC), a field programmable gate array (FPGA), a programmable logic device, a discrete gate or transistor logic component, a discrete hardware component, or any combination thereof). In some cases, the processor is configured to operate a memory array using a memory controller. In other cases, a memory controller is integrated into the processor. In some cases, the processor is configured to execute computer-readable instructions stored in a memory to perform various functions. In some embodiments, a processor includes special purpose components for modem processing, baseband processing, digital signal processing, or transmission processing.

Examples of a memory device include random access memory (RAM), read-only memory (ROM), or a hard disk. Examples of memory devices include solid state memory and a hard disk drive. In some examples, memory is used to store computer-readable, computer-executable software including instructions that, when executed, cause a processor to perform various functions described herein. In some cases, the memory contains, among other things, a basic input/output system (BIOS) which controls basic hardware or software operation such as the interaction with peripheral components or devices. In some cases, a memory controller operates memory cells. For example, the memory controller can include a row decoder, column decoder, or both. In some cases, memory cells within a memory store information in the form of a logical state.

In some cases, one or more aspects described herein may be implemented in whole or in part via software. Software may include code to implement aspects of the present disclosure. Software may be stored in a non-transitory computer-readable medium such as system memory or other memory. In some cases, the software may not be directly executable by the processor but may cause a computer (e.g., when compiled and executed) to perform functions described herein.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Hereinafter, detailed embodiments of the present disclosure will be described with reference to the accompanying drawings.

FIG. 1 is a block diagram illustrating a touch driver according to one embodiment.

Referring to FIG. 1, a touch driver 10 may receive a radio frequency signal from an electronic device. For example, the touch driver 10 may receive a sensing signal from a display panel or a touch panel of a display device. The touch driver 10 may output a digital signal for generating touch coordinates.

The touch driver 10 may include a superheterodyne receiver. The touch driver 10 may convert a partial band signal of the received radio frequency signal into an intermediate frequency signal, and may amplify and detect the intermediate frequency signal and output it. By including the superheterodyne receiver, the touch driver 10 may have improved sensitivity and selectivity as well as improved fidelity over a wide band.

In some aspects, a superheterodyne receiver may down-convert radio frequency (RF) signals to intermediate frequency (IF) signals, and then down-convert the IF signals to baseband signals. A superheterodyne receiver can utilize a bandpass filter with low selectivity because the superheterodyne receiver uses the IF signals. In addition, a superheterodyne receiver may have a lower risk of oscillation (e.g., than a direct conversion receiver) because the superheterodyne receiver amplifies signals not only in the RF stage but also in the IF stage. In addition, a superheterodyne receiver may become less sensitive to variation of the RF signals (e.g., because of the use of the IF stage).

A baseband signal may refer to a signal in a frequency band in which the signal is generated. In some cases, a communication device may generate signals at one frequency (e.g., a relatively low frequency) and then transmit and receive signals at another frequency (e.g., a relatively high frequency). The frequency at which the signal is generated (or processed by the receiver) is sometimes known as the baseband frequency, while the transmission frequency (or reception frequency) is known as the radio frequency. The signals at one frequency (e.g., the transmission frequency) may be converted to another frequency (e.g., the baseband frequency) by combining the received frequency with another signal and filtering the result.

The touch driver 10 may include a first multiplexer 100, a charge amplifier 200, a bandpass filter 300, a first mixer 410, a second mixer 420, a local oscillator 430, a complex bandpass filter 500, a second multiplexer 600, an analog-to-digital converter 700, and a digital signal processor 800.

The first multiplexer 100 may select and output at least a part of a plurality of received radio frequency signals. The first multiplexer 100 may receive the radio frequency signals from the electronic device. The first multiplexer 100 may receive a sensing signal from the display panel or the touch panel of the display device. For example, the first multiplexer 100 may be, for example, a 3:2 multiplexer, but the present disclosure is not limited thereto. The first multiplexer 100 may receive three radio frequency signals and output two radio frequency signals.

The charge amplifier 200 may receive the output of the first multiplexer 100. The charge amplifier 200 may output a voltage proportional to the integral of an input current or the total of input charges. The charge amplifier 200 may function as an integrator.

The bandpass filter 300 may receive the output of the charge amplifier 200 and filter a specific frequency band. The bandpass filter 300 may output a frequency band having a bandwidth of a certain ratio with respect to a center frequency w0 or a resonance frequency. The bandpass filter 300 may output a positive frequency component including the center frequency w0 and a negative frequency component opposite to the positive frequency component. The bandpass filter 300 may remove noise of the radio frequency signal.

The first mixer 410 may receive the specific frequency band from the bandpass filter 300 and may receive a frequency source from the local oscillator 430. The first mixer 410 may output a sine wave or a pulse wave based on the outputs of the bandpass filter 300 and the local oscillator 430. The output of the first mixer 410 may be, for example, an I-path signal, but the present disclosure is not limited thereto. The first mixer 410 may supply a frequency signal having the specific frequency band to a first input terminal IN1 and a second input terminal IN2 of the complex bandpass filter 500. The first mixer 410 may output frequency signals having opposite phases.

The second mixer 420 may receive the specific frequency band from the bandpass filter 300 and may receive the frequency source from the local oscillator 430. The second mixer 420 may output a sine wave or a pulse wave based on the outputs of the bandpass filter 300 and the local oscillator 430. The output of the second mixer 420 may be, for example, a Q-path signal, but the present disclosure is not limited thereto. The second mixer 420 may supply a frequency signal having the specific frequency band to a third input terminal IN3 and a fourth input terminal IN4 of the complex bandpass filter 500. The second mixer 420 may output frequency signals having opposite phases. The phase of the output of the second mixer 420 may be different from the phase of the output of the first mixer 410.

In some embodiments, the complex bandpass filter 500 may receive a frequency signal including a positive frequency component and a negative frequency component from each of the first to fourth input terminals IN1, IN2, IN3, and IN4. The first and second input terminals IN1 and IN2 may correspond to I-path input terminals, and the third and fourth input terminals IN3 and IN4 may correspond to, for example, Q-path input terminals, but the present disclosure is not limited thereto. The phases of the frequency signals applied to the first to fourth input terminals IN1, IN2, IN3, and IN4 may be different from each other. For example, the phase of the frequency signal of the first input terminal IN1 and the phase of the frequency signal of the third input terminal IN3 may have a difference of, for example, 90 degrees, but the present disclosure is not limited thereto.

In some cases, the complex bandpass filter 500 may select and output one of the positive frequency component including the center frequency w0 and the negative frequency component opposite to the positive frequency component. The complex bandpass filter 500 may include first to fourth output terminal OUT1, OUT2, OUT3, and OUT4. The first and second output terminals OUT1 and OUT2 may correspond to I-path output terminals, and the third and fourth output terminals OUT3 and OUT4 may correspond to Q-path output terminals, but are not limited thereto. The phases of the frequency signals outputted from the first to fourth output terminals OUT1, OUT2, OUT3, and OUT4 may be different from each other. The first to fourth output terminals OUT1, OUT2, OUT3, and OUT4 may be connected to the second multiplexer 600.

In some examples, the second multiplexer 600 may select and output some of the N-th outputs (N is a positive integer) of the complex bandpass filter 500. The second multiplexer 600 may output some of the N-th outputs of each of the first to fourth output terminals OUT1, OUT2, OUT3, and OUT4. For example, the second multiplexer 600 may be, for example, an N:1 multiplexer, but the present disclosure is not limited thereto. The second multiplexer 600 may select and output one of the primary output $I_{1+}$ to the N-th output $I_{N+}$ of the first output terminal OUT1. The second multiplexer 600 may select and output one of the primary output $I_{1-}$ to the N-th output $I_{N-}$ of the second output terminal OUT2. The second multiplexer 600 may select and output one of the primary output $Q_{1+}$ to the N-th output $Q_{N+}$ of the third output terminal OUT3. The second multiplexer 600 may select and output one of the primary output $Q_{1-}$ to the N-th output $Q_{N-}$ of the fourth output terminal OUT4.

In some embodiments, the analog-to-digital converter 700 may convert the analog outputs of the second multiplexer 600 into digital signals. The analog outputs of the second multiplexer 600 may correspond to an I-path output and a Q-path output, but are not limited thereto. The analog-to-digital converter 700 may supply the digital signals to the digital signal processor 800.

In some cases, the digital signal processor 800 may receive the output of the analog-to-digital converter 700 and output a digital signal. The digital signal processor 800 may receive the I-path output and the Q-path output from the analog-to-digital converter 700. The digital signal processor 800 may control the phase of the Q-path output to be the same as the phase of the I-path output. Accordingly, the digital signal processor 800 may output the amplified digital signal. The output of the digital signal processor 800 is, for example, a digital signal for generating touch coordinates.

Figure 2:
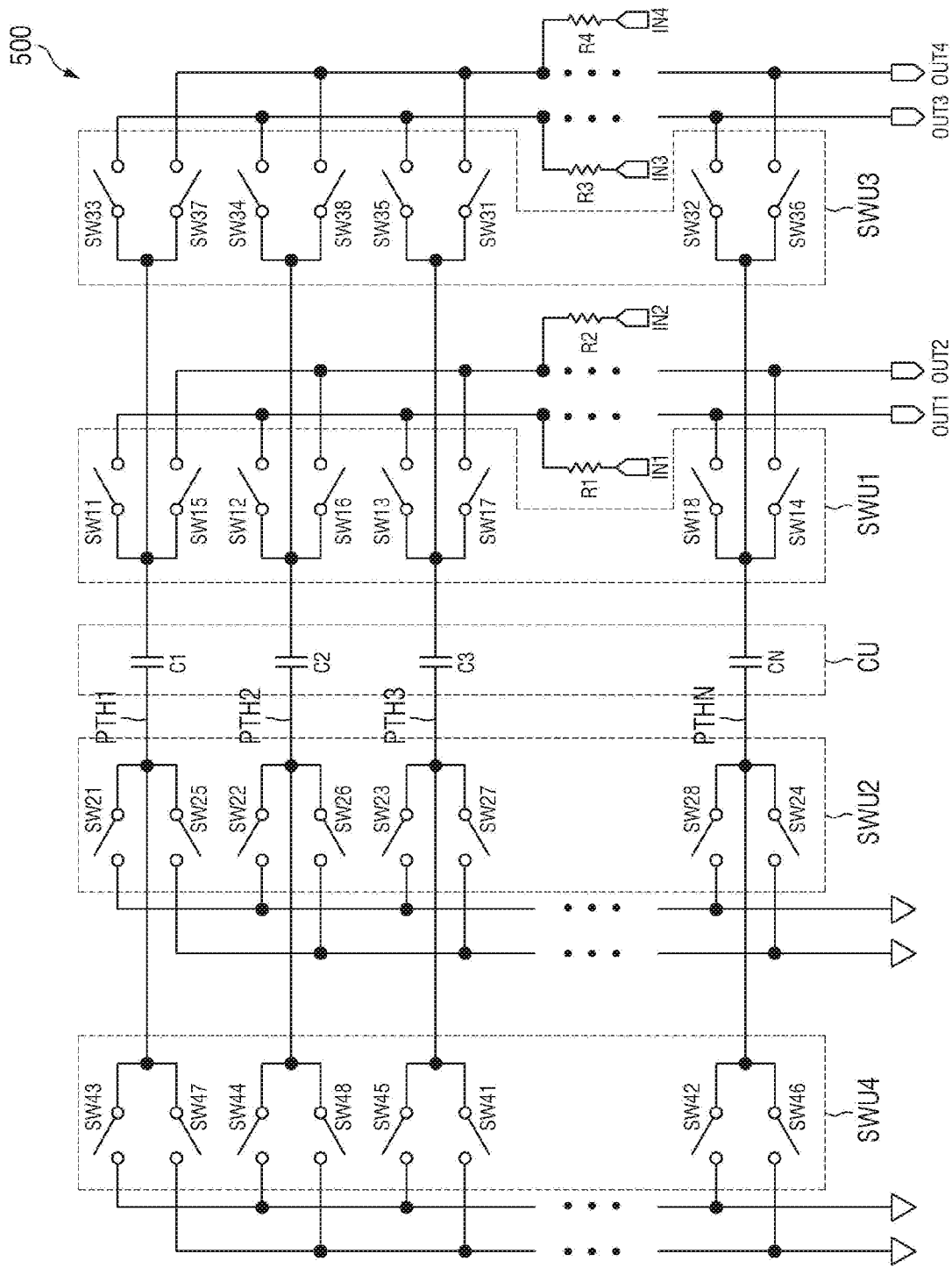
FIG. 2 is a circuit diagram illustrating a complex bandpass filter of a touch driver according to one embodiment.

FIG. 2 is a circuit diagram illustrating a complex bandpass filter of a touch driver according to one embodiment.

Referring to FIG. 2, the complex bandpass filter 500 may include the first to fourth input terminals IN1, IN2, IN3, and IN4, first to fourth load resistors R1, R2, R3 and R4, a first switching unit SWU1, a capacitor unit CU, a second switching unit SWU2, a third switching unit SWU3, a fourth switching unit SWU4, and the first to fourth output terminals OUT1, OUT2, OUT3, and OUT4.

In some aspects, the first and second input terminals IN1 and IN2 may correspond to I-path input terminals. Input signals of the first and second input terminals IN1 and IN2 may have opposite phases. The first input terminal IN1 is, for example, connected to the ground GND through the first load resistor R1, the first switching unit SWU1, the capacitor unit CU, and the second switching unit SWU2 that are connected in series. The second input terminal IN2 is, for example, connected to the ground GND through the second load resistor R2, the first switching unit SWU1, the capacitor unit CU, and the second switching unit SWU2 that are connected in series. Each of the first and second input terminals IN1 and IN2 may be connected to the ground GND through N paths PTH1, PTH2, PTH3, . . . , and PTHN.

In some embodiments, the first switching unit SWU1 may include a first-first switching element SW11, a first-second switching element SW12, a first-third switching element SW13, a first-fourth switching element SW14, a first-fifth switching element SW15, a first-sixth switching element SW16, a first-seventh switching element SW17, and an first-eighth switching element SW18. The capacitor unit CU may include a first capacitor C1, a second capacitor C2, a third capacitor C3, . . . , and an N-th capacitor CN. The second switching unit SWU2 may include a second-first switching element SW21, a second-second switching element SW22, a second-third switching element SW23, a second-fourth switching element SW24, a second-fifth switching element SW25, a second-sixth switching element SW26, a second-seventh switching element SW27, and a second-eighth switching element SW28. Each of the switching elements of the first and second switching unit SWU1 and SWU2 is, for example, a transistor, but the present disclosure is not limited thereto. Switch-on resistance of one switching element of each of the first switching unit SWU1 and the second switching unit SWU2 is, in some examples, equivalent to 1 to 10 k Ohm. Accordingly, the magnitude of the switch-on resistance of the first switching unit SWU1 and the second switching unit SWU2 may not affect a frequency characteristic.

In some examples, the first input terminal IN1 is, in some examples, connected to the ground GND through the first load resistor R1, the first-first switching element SW11, the first capacitor C1, and the second-first switching element SW21. The first-first switching element SW11 and the second-first switching element SW21 may be turned on based on a clock signal having a first phase to connect the first path PTH1.

The second input terminal IN2 is, in some examples, connected to the ground GND through the second load resistor R2, the first-fifth switching element SW15, the first capacitor C1, and the second-fifth switching element SW25. The first-fifth switching element SW15 and the second-fifth switching element SW25 may be turned on based on a clock signal having a fifth phase to connect the first path PTH1. The fifth phase may be opposite to the first phase.

The first input terminal IN1 is, in some examples, connected to the ground GND through the first load resistor R1, the first-second switching element SW12, the second capacitor C2, and the second-second switching element SW22. The first-second switching element SW12 and the second-second switching element SW22 is, in some examples, turned on based on a clock signal having a second phase to connect the second path PTH2. The second phase and the first phase may have a difference of 45 degrees. The second phase is, for example, delayed by 45 degrees from the first phase.

In some embodiments, the second input terminal IN2 may be connected to the ground GND through the second load resistor R2, the first-sixth switching element SW16, the second capacitor C2, and the second-sixth switching element SW26. The first-sixth switching element SW16 and the second-sixth switching element SW26 may be turned on based on a clock signal having a sixth phase to connect the second path PTH2. The sixth phase may be opposite to the second phase. The sixth phase is, in some examples, delayed by 180 degrees from the second phase.

In some cases, the first input terminal IN1 may be connected to the ground GND through the first load resistor R1, the first-third switching element SW13, the third capacitor C3, and the second-third switching element SW23. The first-third switching element SW13 and the second-third switching element SW23 may be turned on based on a clock signal having a third phase to connect the third path PTH3. The third phase and the second phase may have a difference of 45 degrees. The third phase may be delayed by 45 degrees from the second phase.

In some examples, the second input terminal IN2 may be connected to the ground GND through the second load resistor R2, the first-seventh switching element SW17, the third capacitor C3, and the second-seventh switching element SW27. The first-seventh switching element SW17 and the second-seventh switching element SW27 may be turned on based on a clock signal having a seventh phase to connect the third path PTH3. The seventh phase may be opposite to the third phase. The seventh phase may be delayed by 180 degrees from the third phase.

In some embodiments, the first input terminal IN1 may be connected to the ground GND through the first load resistor R1, the first-eighth switching element SW18, the N-th capacitor CN, and the second-eighth switching element SW28. The first-eighth switching element SW18 and the second-eighth switching element SW28 is, in some examples, turned on based on a clock signal having an eighth phase to connect the N-th path PTHN. The eighth phase may be opposite to a fourth phase. The eighth phase is, in some examples, delayed by 180 degrees from the fourth phase.

In some cases, the second input terminal IN2 may be connected to the ground GND through the second load resistor R2, the first-fourth switching element SW14, the N-th capacitor CN, and the second-fourth switching element SW24. The first-fourth switching element SW14 and the second-fourth switching element SW24 may be turned on based on a clock signal having the fourth phase to connect the N-th path PTHN. The fourth phase and the third phase may have a difference of 45 degrees. The fourth phase may be delayed by 45 degrees from the third phase.

In some embodiments, the first switching unit SWU1 and the second switching unit SWU2 may connect the N paths PTH1, PTH2, PTH3, . . . , and PTHN based on the clock signals having the first to eighth phases. Accordingly, each of the first and second input terminals IN1 and IN2 may be connected to the ground GND along the path determined by the clock signal.

In some examples, the first output terminal OUT1 may be connected to the first input terminal IN1 through the first load resistor R1. The first output terminal OUT1 may be connected to the ground GND through the first switching unit SWU1, the capacitor unit CU, and the second switching unit SWU2. The second output terminal OUT2 may be connected to the second input terminal IN2 through the second load resistor R2. The second output terminal OUT2 may be connected to the ground GND through the first switching unit SWU1, the capacitor unit CU, and the second switching unit SWU2. The first and second output terminals OUT1 and OUT2 may correspond to I-path output terminals.

In some cases, the third and fourth input terminals IN3 and IN4 may correspond to Q-path input terminals. Input signals of the third and fourth input terminals IN3 and IN4 may have opposite phases. The third input terminal IN3 may be connected to the ground GND through the third load resistor R3, the third switching unit SWU3, the capacitor unit CU, and the fourth switching unit SWU4 that are connected in series. The fourth input terminal IN4 may be connected to the ground GND through the fourth load resistor R4, the third switching unit SWU3, the capacitor unit CU, and the fourth switching unit SWU4 that are connected in series. Each of the third and fourth input terminals IN3 and IN4 is, for example, connected to the ground GND through the N paths PTH1, PTH2, PTH3, . . . , and PTHN.

In some embodiments, the third switching unit SWU3 may include a third-first switching element SW31, a third-second switching element SW32, a third-third switching element SW33, a third-fourth switching element SW34, a third-fifth switching element SW35, a third-sixth switching element SW36, a third-seventh switching element SW37, and a third-eighth switching element SW38. The fourth switching unit SWU4 may include a fourth-first switching element SW41, a fourth-second switching element SW42, a fourth-third switching element SW43, a fourth-fourth switching element SW44, a fourth-fifth switching element SW45, a fourth-sixth switching element SW46, a fourth-seventh switching element SW47, and a fourth-eighth switching element SW48. Each of the switching elements of the third switching unit SWU3 and the fourth switching unit SWU4 is, in some examples, a transistor, but the present disclosure is not limited thereto. Switch-on resistance of one switching element of each of the third switching unit SWU3 and the fourth switching unit SWU4 is, for example, equivalent to 1 to 10 k Ohm. Accordingly, the magnitude of the switch-on resistance of the third switching unit SWU3 and the fourth switching unit SWU4 may not affect the frequency characteristic.

The third input terminal IN3 may be connected to the ground GND through the third load resistor R3, the third-third switching element SW33, the first capacitor C1, and the fourth-third switching element SW43. The third-third switching element SW33 and the fourth-third switching element SW43 may be turned on based on the clock signal having the third phase to connect the first path PTH1. The third phase and the first phase may, for example, have a difference of 90 degrees.

In some examples, the fourth input terminal IN4 may be connected to the ground GND through the fourth load resistor R4, the third-seventh switching element SW37, the first capacitor C1, and the fourth-seventh switching element SW47. The third-seventh switching element SW37 and the forty seventh switching element SW47 may be turned on based on the clock signal having the seventh phase to connect the first path PTH1. The seventh phase is, for example, opposite to the third phase.

In some embodiments, the third input terminal IN3 may be connected to the ground GND through the third load resistor R3, the third-fourth switching element SW34, the second capacitor C2, and the fourth-fourth switching element SW44. The third-fourth switching element SW34 and the fourth-fourth switching element SW44 may be turned on based on the clock signal having the fourth phase to connect the second path PTH2. The fourth phase and the third phase may have a difference of 45 degrees. The fourth phase is, for example, delayed by 45 degrees from the third phase.

The fourth input terminal IN4 may be connected to the ground GND through the fourth load resistor R4, the third-eighth switching element SW38, the second capacitor C2, and the fourth-eighth switching element SW48. The third-eighth switching element SW38 and the fourth-eighth switching element SW48 may be turned on based on the clock signal having the eighth phase to connect the second path PTH2. The eighth phase may be opposite to the fourth phase.

In some cases, the third input terminal IN3 may be connected to the ground GND through the third load resistor R3, the third-fifth switching element SW35, the third capacitor C3, and the fourth-fifth switching element SW45. The third-fifth switching element SW35 and the fourth-fifth switching element SW45 may be turned on based on the clock signal having the fifth phase to connect the third path PTH3. The fifth phase and the fourth phase may have a difference of 45 degrees. The fifth phase is, for example, delayed by 45 degrees from the fourth phase.

The fourth input terminal IN4 may be connected to the ground GND through the fourth load resistor R4, the third-first switching element SW31, the third capacitor C3, and the fourth-first switching element SW41. The third-first switching element SW31 and the fourth-first switching element SW41 may be turned on based on the clock signal having the first phase to connect the third path PTH3. The first phase may be opposite to the fifth phase. The fifth phase is, for example, delayed by 180 degrees from the first phase.

The third input terminal IN3 may be connected to the ground GND through the third load resistor R3, the third-second switching element SW32, the N-th capacitor CN, and the fourth-second switching element SW42. The third-second switching element SW32 and the fourth-second switching element SW42 may be turned on based on the clock signal having the second phase to connect the N-th path PTHN. The second phase and the first phase may have a difference of 45 degrees. The second phase is, for example, delayed by 45 degrees from the first phase.

The fourth input terminal IN4 may be connected to the ground GND through the fourth load resistor R4, the third-sixth switching element SW36, the N-th capacitor CN, and the fourth-sixth switching element SW46. The third-sixth switching element SW36 and the fourth-sixth switching element SW46 may be turned on based on the clock signal having the sixth phase to connect the N-th path PTHN. The sixth phase may be opposite to the second phase. The sixth phase is, for example, delayed by 180 degrees from the second phase.

In some cases, the third switching unit SWU3 and the fourth switching unit SWU4 may connect the N paths PTH1, PTH2, PTH3, . . . , and PTHN based on the clock signals having the first to eighth phases. Accordingly, each of the third and fourth input terminals IN3 and IN4 may be connected to the ground GND along the path determined by the clock signal.

The third output terminal OUT3 may be connected to the third input terminal IN3 through the third load resistor R3. The third output terminal OUT3 may be connected to the ground GND through the third switching unit SWU3, the capacitor unit CU, and the fourth switching unit SWU4. The fourth output terminal OUT4 may be connected to the fourth input terminal IN4 through the fourth load resistor R4. The fourth output terminal OUT4 may be connected to the ground GND through the third switching unit SWU3, the capacitor unit CU, and the fourth switching unit SWU4. The third and fourth output terminals OUT3 and OUT4 may correspond to Q-path output terminals.

In some embodiments, the phases of the frequency signals applied to the first to fourth input terminals IN1, IN2, IN3, and IN4 may be different from each other. The switching elements of the first switching unit SWU1 may receive the clock signals having the different phases and may be sequentially connected to the N paths. The switching elements of the second switching unit SWU2 may receive the clock signals having the different phases and may be sequentially connected to the N paths. The switching elements of the third switching unit SWU3 may receive the clock signals having the different phases and may be sequentially connected to the N paths. The switching elements of the fourth switching unit SWU4 may receive the clock signals having the different phases and may be sequentially connected to the N paths. Accordingly, the complex bandpass filter 500 may remove a negative frequency component from the received frequency signal, and may select and output a positive frequency component.

The complex bandpass filter 500 may not include an operational transconductance amplifier (OTA) for frequency shifting, and may implement a complex notch filter using the switching elements, the load resistors, and the capacitors. In some cases, an OTA may include various components, for example, such as a bias current circuit, a transconducting circuit, a current divider, an output circuit, etc. Since the complex bandpass filter 500 does not include the OTA, the complex bandpass filter 500 may be implemented in a relatively small area with low (e.g., reduced) power consumption. The complex bandpass filter 500 may solve a DC offset problem and may not require an additional tuning circuit for alleviating the change in the frequency characteristic. That is, embodiments of the inventive concept may mitigate a problem of a DC offset that occurs when leakage of the local signal is self-received in the mixer. Embodiments of the inventive concept may also mitigate issues that happen when the second-order intermodulation (IM2) occurs due to non-linearity of the mixer (i.e., a problem of interference to a target signal).

Figure 3:
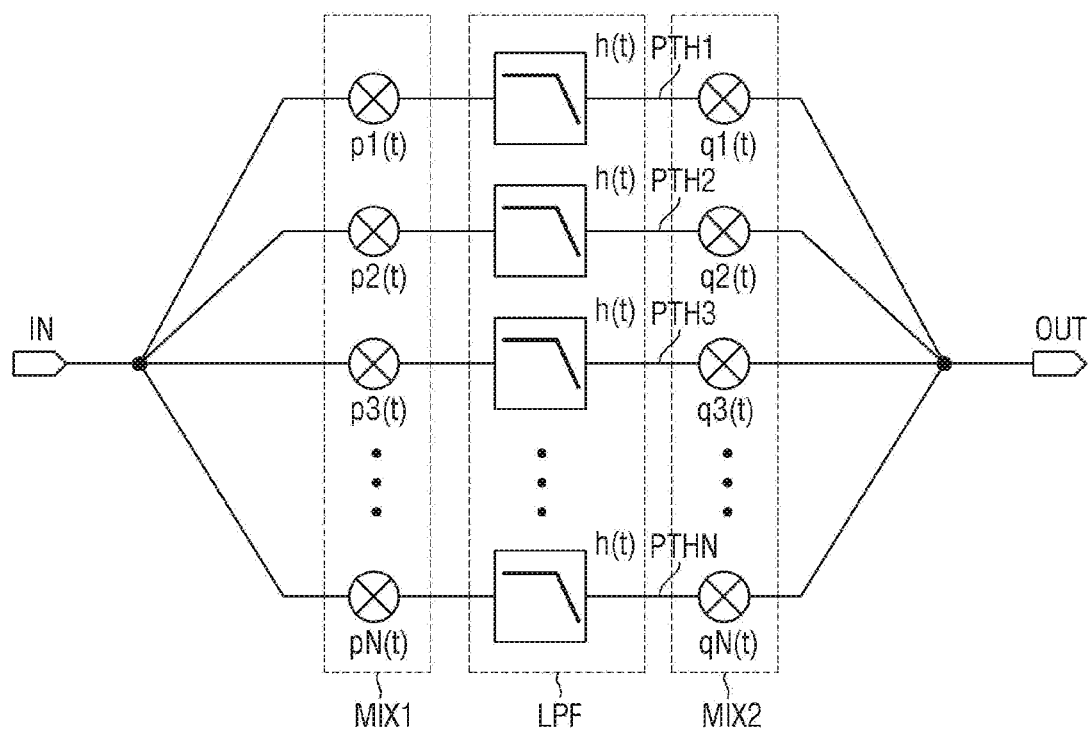
FIG. 3 is a conceptual diagram illustrating a complex bandpass filter according to one embodiment.
Figure 4:
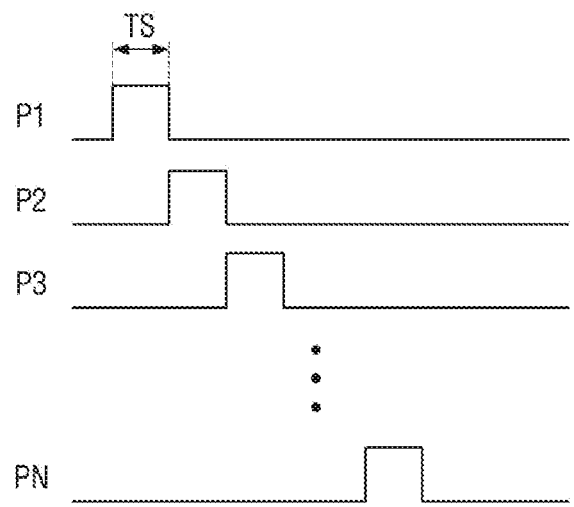
FIG. 4 is a timing diagram illustrating clock signals applied to the complex bandpass filter according to one embodiment.
Figure 5:
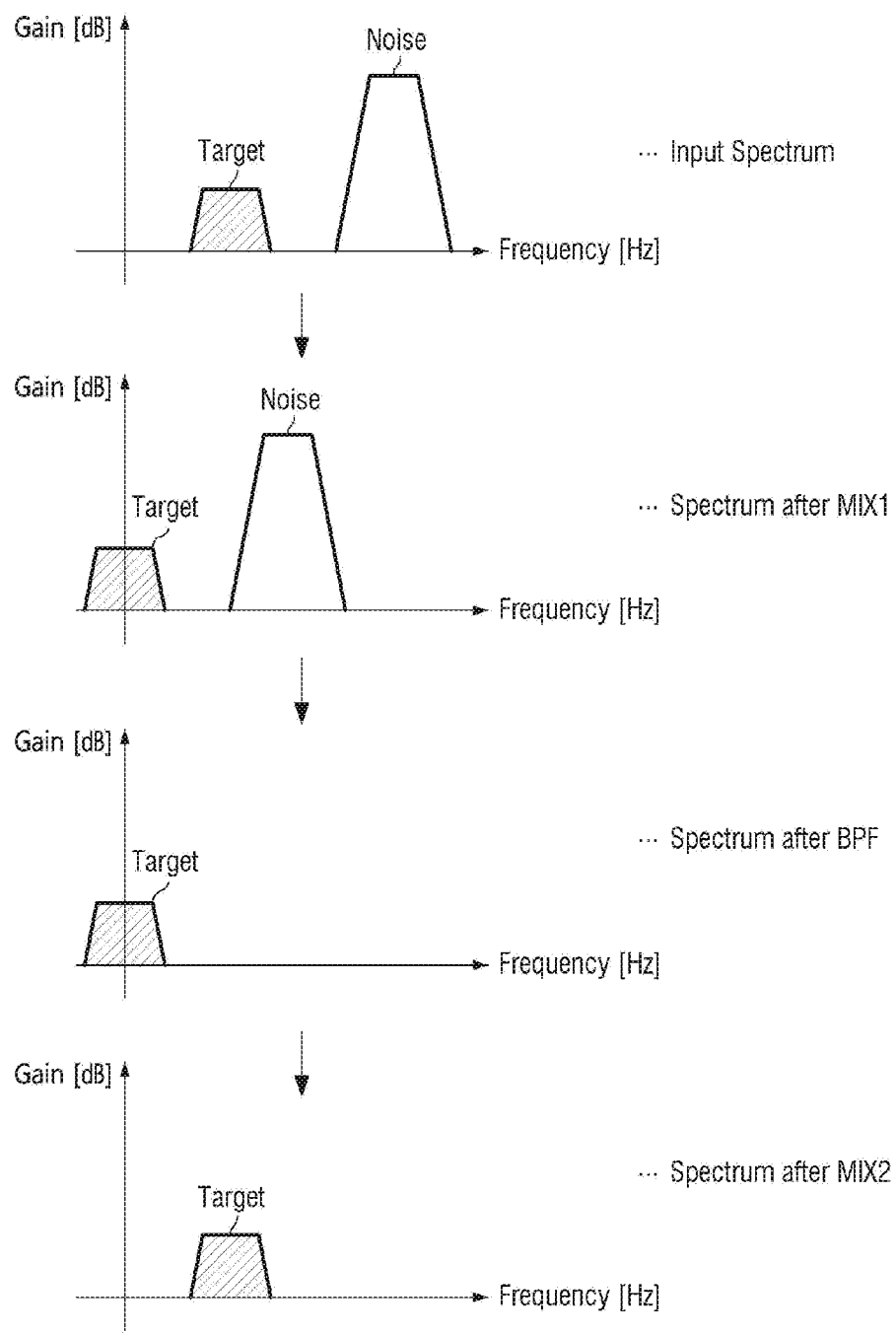
FIG. 5 is a diagram showing a filtering process of the complex bandpass filter according to one embodiment.

FIG. 3 is a conceptual diagram illustrating a complex bandpass filter according to one embodiment, FIG. 4 is a timing diagram illustrating clock signals applied to the complex bandpass filter according to one embodiment, and FIG. 5 is a diagram showing a filtering process of the complex bandpass filter according to one embodiment.

Referring to FIGS. 3 to 5, the complex bandpass filter 500 may include an input terminal IN, a down-conversion unit MIX1, a low pass filter LPF, an up-conversion unit MIX2, and an output terminal OUT. The complex bandpass filter 500 may include the N paths PTH1, PTH2, PTH3, . . . , and PTHN. The complex bandpass filter 500 may sequentially operate the N paths through N clock signals P1, P2, P3, . . . , and PN whose phases are sequentially delayed. The N clock signals P1, P2, P3, . . . , and PN may have the same pulse width TS, but the present disclosure is not limited thereto.

The input terminal IN of the complex bandpass filter 500 may receive a frequency signal including a positive frequency component and a negative frequency component. An input spectrum of the frequency signal may include a target frequency band (Target) and a noise frequency band (Noise). The input spectrum is, for example, divided into the N paths according to phases.

The down-conversion unit MIX1 may down-convert a frequency of the input spectrum. The down-conversion unit MIX1 may include a plurality of mixers represented by time functions $p1(t)$, $p2(t)$, $p3(t)$, . . . , and pN(t). The target frequency band of the spectrum having passed through the down-conversion unit MIX1 may include a DC component.

The low pass filter LPF may pass a low-frequency component and remove a high-frequency component. The low pass filter LPF may include a plurality of RC circuits represented by a time function h(t). The low pass filter LPF may pass the target frequency band including a DC component and remove the noise frequency band.

The up-conversion unit MIX2 may up-convert a frequency of an output spectrum of the low pass filter LPF. The up-conversion unit MIX2 may include a plurality of mixers represented by time functions $q1(t)$, $q2(t)$, $q3(t)$, . . . , and qN(t). The target frequency band of the spectrum having passed through the up-conversion unit MIX2 is, for example, the same as the target frequency band of the input spectrum. The output of the up-conversion unit MIX2 may be merged at the output terminal OUT. Accordingly, the complex bandpass filter 500 may pass the target frequency band and remove the noise frequency band.

Figure 6:
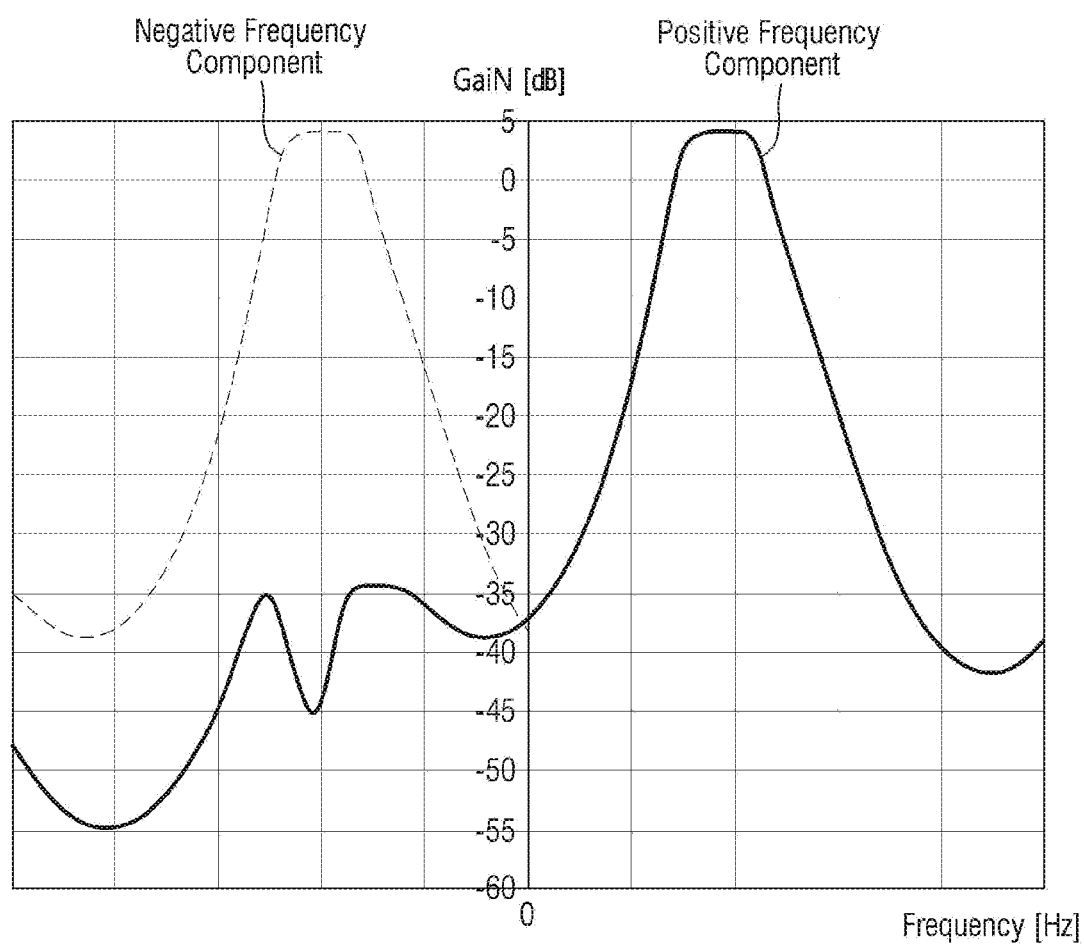
FIG. 6 is a graph illustrating an output of a complex bandpass filter according to one embodiment.

FIG. 6 is a graph illustrating an output of a complex bandpass filter according to one embodiment. In the graph of FIG. 6, a horizontal axis may indicate a frequency, and a vertical axis may indicate a gain.

Referring to FIG. 6, the complex bandpass filter 500 may pass a positive frequency component and remove a negative frequency component. Accordingly, the complex bandpass filter 500 may select and output a positive frequency component from the output of the bandpass filter 300. For instance, a complex bandpass filter 500 may have a signal transfer function at a frequency to pass the desired frequency component (e.g., of a composite signal or input signal) and a noise transfer function to block a residual portion (e.g., of a composite signal or input signal).

Figure 7:
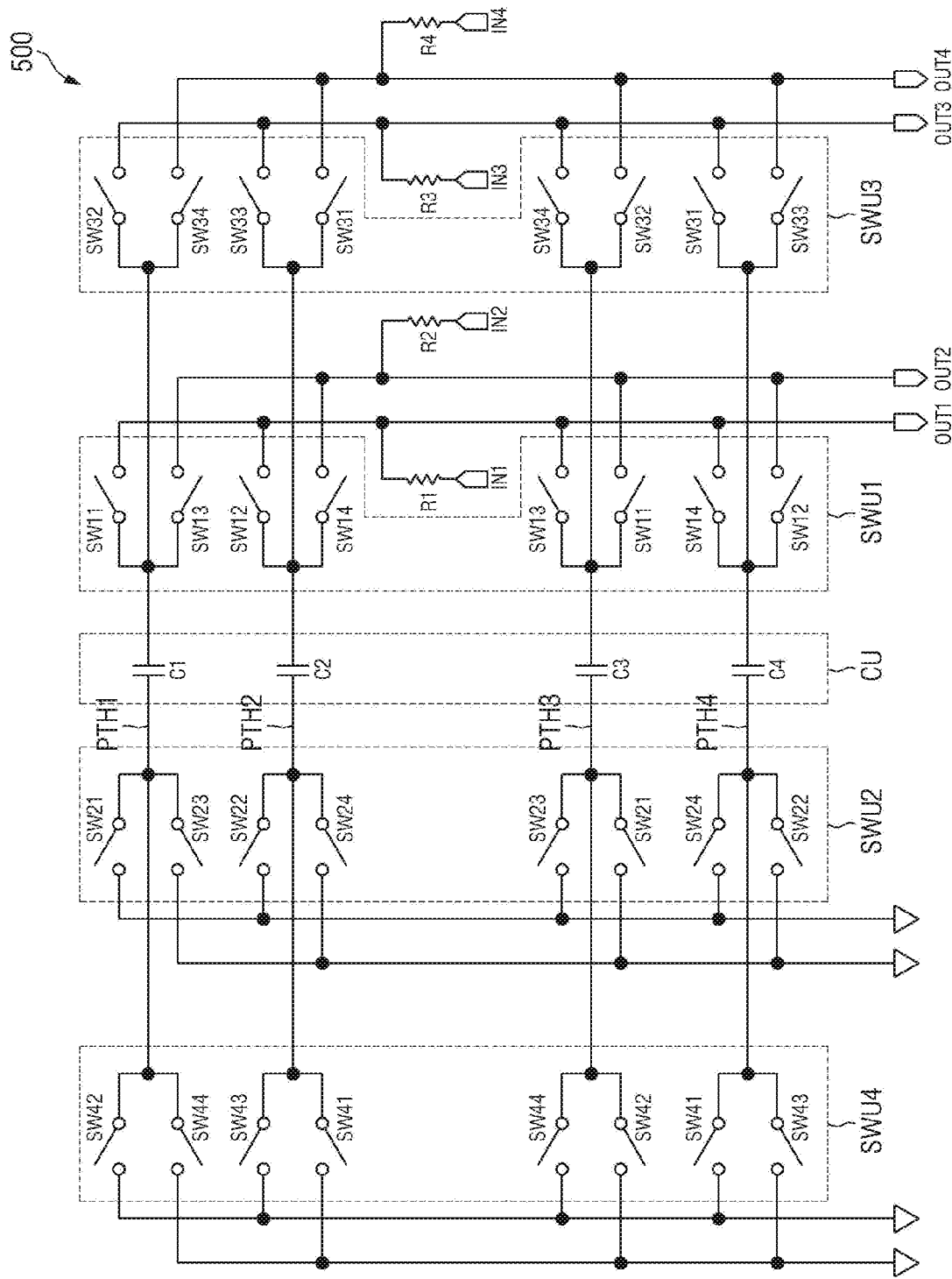
FIG. 7 is a circuit diagram illustrating a complex bandpass filter according to another embodiment.
Figure 8:
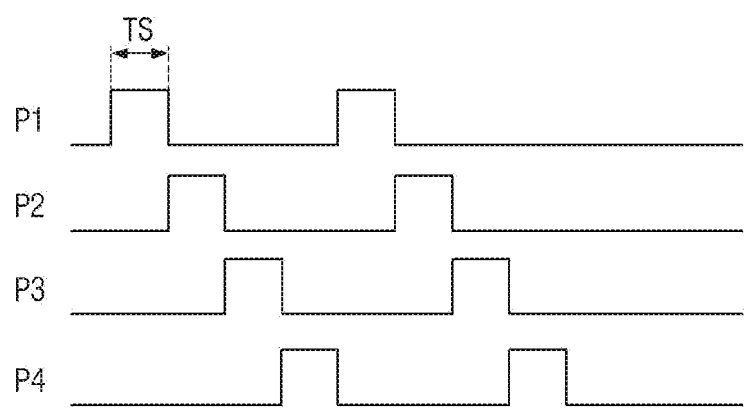
FIG. 8 is a timing diagram illustrating clock signals applied to the complex bandpass filter of FIG. 7.
Figure 9:
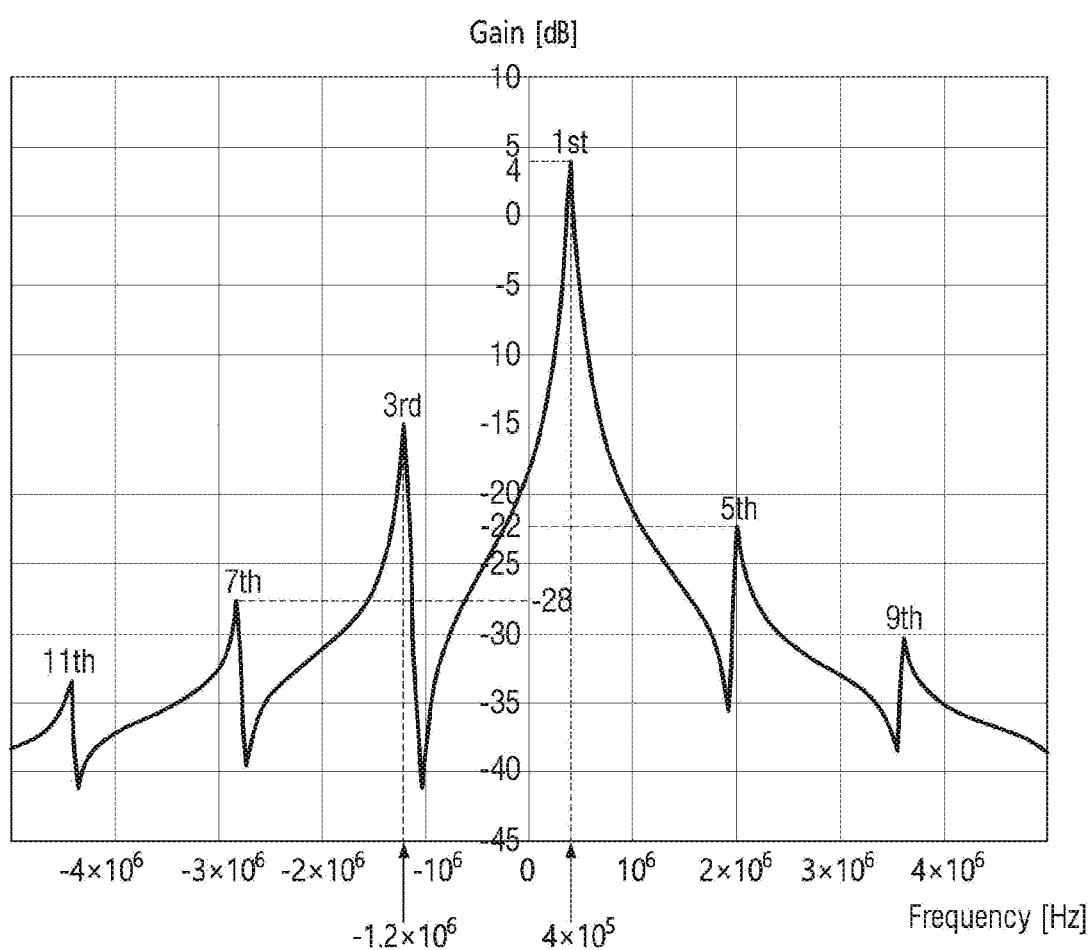
FIG. 9 is a graph representing an output of the complex bandpass filter of FIG. 7.

FIG. 7 is a circuit diagram illustrating a complex bandpass filter according to another embodiment, FIG. 8 is a timing diagram illustrating clock signals applied to the complex bandpass filter of FIG. 7, and FIG. 9 is a graph representing an output of the complex bandpass filter of FIG. 7.

Referring to FIGS. 7 to 9, the complex bandpass filter 500 may include the first to fourth paths PTH1, PTH2, PTH3, and PTH4. The complex bandpass filter 500 may sequentially operate the first to fourth paths PTH1, PTH2, PTH3, and PTH4 through the first to fourth clock signals P1, P2, P3, and P4 whose phases are sequentially delayed. The first clock signal P1 may have a first phase, the second clock signal P2 may have a second phase, the third clock signal P3 may have a third phase, and the fourth clock signal P4 may have a fourth phase. In FIGS. 7 to 9, the second phase and the first phase may have a difference of 90 degrees. The first to fourth clock signals P1, P2, P3, and P4 may have the same pulse width TS, but the present disclosure is not limited thereto.

In some examples, the complex bandpass filter 500 may include the first to fourth input terminals IN1, IN2, IN3, and IN4, first to fourth load resistors R1, R2, R3 and R4, a first switching unit SWU1, a capacitor unit CU, a second switching unit SWU2, a third switching unit SWU3, a fourth switching unit SWU4, and the first to fourth output terminals OUT1, OUT2, OUT3, and OUT4.

In some cases, the first and second input terminals IN1 and IN2 may correspond to I-path input terminals. Input signals of the first and second input terminals IN1 and IN2 may have opposite phases. The first input terminal IN1 may be connected to the ground GND through the first load resistor R1, the first switching unit SWU1, the capacitor unit CU, and the second switching unit SWU2 that are connected in series. The second input terminal IN2 may be connected to the ground GND through the second load resistor R2, the first switching unit SWU1, the capacitor unit CU, and the second switching unit SWU2 that are connected in series. Each of the first and second input terminals IN1 and IN2 may be connected to the ground GND through the first to fourth paths PTH1, PTH2, PTH3, and PTH4.

In some embodiments, the first switching unit SWU1 may include the first-first switching element SW11, the first-second switching element SW12, the first-third switching element SW13, and the first-fourth switching element SW14.

The capacitor unit CU may include the first capacitor C1, the second capacitor C2, the third capacitor C3, and the fourth capacitor C4. In some aspects, a capacitor (e.g., one or more aspects of the capacitor unit CU and/or capacitors C1 through CN described herein) is an electrical component that stores energy in an electric field. In some examples, capacitors may contain two or more electrical conductors separated to prevent the conductors from contacting. These conductors may be in the form of metal plates or sheets. As charge moves through a circuit containing a capacitor and a voltage source, electrons accumulate on one of the sheets. Capacitors may be used to store energy, to create a pulse of energy, to smooth current, to couple or decouple signals, and for other purposes. Dielectric material may be used to separate the conductors in a capacitor. Dielectric materials include glass, ceramic, polymers, paper, mica, or oxides. The type of material used may affect properties of the capacitor, including its capacity for charge (capacitance), the amount of voltage that may be applied before failing, and the operating temperature of the capacitor. A capacitor may fail once it can no longer hold a charge, which may happen when its dielectric becomes conductive (e.g., at a certain temperature), or after degradation of the material. Specifically, in some cases capacitors may generate high temperatures under continuous operation. This may make them unsuitable for some continuous high voltage operations.

The second switching unit SWU2 may include the second-first switching element SW21, the second-second switching element SW22, the second-third switching element SW23, and the second-fourth switching element SW24. Each of the switching elements of the first and second switching unit SWU1 and SWU2 may be a transistor, for example, but the present disclosure is not limited thereto. Switch-on resistance of one switching element of each of the first switching unit SWU1 and the second switching unit SWU2 is, for example, equivalent to 1 to 10 k Ohm. Accordingly, the magnitude of the switch-on resistance of the first switching unit SWU1 and the second switching unit SWU2 may not affect a frequency characteristic.

In some examples, the first input terminal IN1 may be connected to the ground GND through the first load resistor R1, the first-first switching element SW11, the first capacitor C1, and the second-first switching element SW21. The first-first switching element SW11 and the second-first switching element SW21 may be turned on based on the first clock signal P1 having the first phase to connect the first path PTH1.

In some embodiments, the second input terminal IN2 may be connected to the ground GND through the second load resistor R2, the first-third switching element SW13, the first capacitor C1, and the second-third switching element SW23. The first-third switching element SW13 and the second-third switching element SW23 may be turned on based on the third clock signal P3 having the third phase to connect the first path PTH1. The third phase is, for example, opposite to the first phase.

The first input terminal IN1 may be connected to the ground GND through the first load resistor R1, the first-second switching element SW12, the second capacitor C2, and the second-second switching element SW22. The first-second switching element SW12 and the second-second switching element SW22 may be turned on based on the second clock signal P2 having the second phase to connect the second path PTH2. The second phase and the first phase may have a difference of 90 degrees. The second phase may be delayed by 90 degrees from the first phase.

In some cases, the second input terminal IN2 may be connected to the ground GND through the second load resistor R2, the first-fourth switching element SW14, the second capacitor C2, and the second-fourth switching element SW24. The first-fourth switching element SW14 and the second-fourth switching element SW24 may be turned on based on the fourth clock signal P4 having the fourth phase to connect the second path PTH2. The fourth phase may be opposite to the second phase. The fourth phase may be delayed by 180 degrees from the second phase.

In some cases, the first input terminal IN1 may be connected to the ground GND through the first load resistor R1, the first-third switching element SW13, the third capacitor C3, and the second-third switching element SW23. The first-third switching element SW13 and the second-third switching element SW23 may be turned on based on the third clock signal P3 having the third phase to connect the third path PTH3. The third phase and the second phase may have a difference of 90 degrees. The third phase may be delayed by 90 degrees from the second phase.

In some embodiments, the second input terminal IN2 may be connected to the ground GND through the second load resistor R2, the first-first switching element SW11, the third capacitor C3, and the second-first switching element SW21. The first-first switching element SW11 and the second-first switching element SW21 may be turned on based on the first clock signal P1 having the first phase to connect the third path PTH3. The first phase may be opposite to the third phase.

In some examples, the first input terminal IN1 may be connected to the ground GND through the first load resistor R1, the first-fourth switching element SW14, the fourth capacitor C4, and the second-fourth switching element SW24. The first-fourth switching element SW14 and the second-fourth switching element SW24 may be turned on based on the fourth clock signal P4 having the fourth phase to connect the fourth path PTH4. The fourth phase and the third phase may have a difference of 90 degrees. The fourth phase is, for example, delayed by 90 degrees from the third phase.

In some embodiments, the second input terminal IN2 may be connected to the ground GND through the second load resistor R2, the first-second switching element SW12, the fourth capacitor C4, and the second-second switching element SW22. The first-second switching element SW12 and the second-second switching element SW22 may be turned on based on the second clock signal P2 having the second phase to connect the fourth path PTH4. The second phase is, for example, opposite to the fourth phase.

In some examples, the first switching unit SWU1 and the second switching unit SWU2 may connect the first to fourth paths PTH1, PTH2, PTH3, and PTH4 based on the first to fourth clock signals P1, P2, P3, and P4 having the first to fourth phases. Accordingly, each of the first and second input terminals IN1 and IN2 may be connected to the ground GND along the path determined by the clock signal.

In some cases, the first output terminal OUT1 may be connected to the first input terminal IN1 through the first load resistor R1. The first output terminal OUT1 may be connected to the ground GND through the first switching unit SWU1, the capacitor unit CU, and the second switching unit SWU2. The second output terminal OUT2 may be connected to the second input terminal IN2 through the second load resistor R2. The second output terminal OUT2 may be connected to the ground GND through the first switching unit SWU1, the capacitor unit CU, and the second switching unit SWU2. The first and second output terminals OUT1 and OUT2 may correspond to I-path output terminals.

In some embodiments, the third and fourth input terminals IN3 and IN4 may correspond to Q-path input terminals. Input signals of the third and fourth input terminals IN3 and IN4 may have opposite phases. The third input terminal IN3 may be connected to the ground GND through the third load resistor R3, the third switching unit SWU3, the capacitor unit CU, and the fourth switching unit SWU4 that are connected in series. The fourth input terminal IN4 may be connected to the ground GND through the fourth load resistor R4, the third switching unit SWU3, the capacitor unit CU, and the fourth switching unit SWU4 that are connected in series. Each of the third and fourth input terminals IN3 and IN4 may be connected to the ground GND through the first to fourth paths PTH1, PTH2, PTH3, and PTH4.

In some cases, the third switching unit SWU3 may include the third-first switching element SW31, the third-second switching element SW32, the third-third switching element SW33, and the third-fourth switching element SW34. The fourth switching unit SWU4 may include the fourth-first switching element SW41, the fourth-second switching element SW42, the fourth-third switching element SW43, and the fourth-fourth switching element SW44. Each of the switching elements of the third switching unit SWU3 and the fourth switching unit SWU4 may be a transistor, for example, but the present disclosure is not limited thereto. Switch-on resistance of one switching element of each of the third switching unit SWU3 and the fourth switching unit SWU4 may be equivalent to 1 to 10 k Ohm. Accordingly, the magnitude of the switch-on resistance of the third switching unit SWU3 and the fourth switching unit SWU4 may not affect the frequency characteristic.

In some examples, the third input terminal IN3 may be connected to the ground GND through the third load resistor R3, the third-second switching element SW32, the first capacitor C1, and the fourth-second switching element SW42. The third-second switching element SW32 and the fourth-second switching element SW42 may be turned on based on the second clock signal P2 having the second phase to connect the first path PTH1. The second phase and the first phase may have a difference of 90 degrees. The second phase is, for example, delayed by 90 degrees from the first phase.

In some embodiments, the fourth input terminal IN4 may be connected to the ground GND through the fourth load resistor R4, the third-fourth switching element SW34, the first capacitor C1, and the fourth-fourth switching element SW44. The third-fourth switching element SW34 and the fourth-fourth switching element SW44 may be turned on based on the fourth clock signal P4 having the fourth phase to connect the first path PTH1. The fourth phase may be opposite to the second phase. The fourth phase is, for example, delayed by 180 degrees from the second phase.

The third input terminal IN3 may be connected to the ground GND through the third load resistor R3, the third-third switching element SW33, the second capacitor C2, and the fourth-third switching element SW43. The third-third switching element SW33 and the fourth-third switching element SW43 may be turned on based on the third clock signal P3 having the third phase to connect the second path PTH2. The third phase and the second phase may have a difference of 90 degrees. The third phase is, for example, delayed by 90 degrees from the second phase.

In some cases, the fourth input terminal IN4 may be connected to the ground GND through the fourth load resistor R4, the third-first switching element SW31, the second capacitor C2, and the fourth-first switching element SW41. The third-first switching element SW31 and the fourth-first switching element SW41 may be turned on based on the first clock signal P1 having the first phase to connect the second path PTH2. The first phase may be opposite to the third phase.

In some examples, the third input terminal IN3 may be connected to the ground GND through the third load resistor R3, the third-fourth switching element SW34, the third capacitor C3, and the fourth-fourth switching element SW44. The third-fourth switching element SW34 and the fourth-fourth switching element SW44 may be turned on based on the fourth clock signal P4 having the fourth phase to connect the third path PTH3. The fourth phase and third phase may have a difference of 90 degrees. The fourth phase is, for example, delayed by 90 degrees from the third phase.

The fourth input terminal IN4 may be connected to the ground GND through the fourth load resistor R4, the third-second switching element SW32, the third capacitor C3, and the fourth-second switching element SW42. The third-second switching element SW32 and the fourth-second switching element SW42 may be turned on based on the second clock signal P2 having the second phase to connect the third path PTH3. The second phase may be opposite to the fourth phase.

In some embodiments, the third input terminal IN3 may be connected to the ground GND through the third load resistor R3, the third-first switching element SW31, the fourth capacitor C4, and the fourth-first switching element SW41. The third-first switching element SW31 and the fourth-first switching element SW41 may be turned on based on the clock signal having the first phase to connect the fourth path PTH4.

The fourth input terminal IN4 may be connected to the ground GND through the fourth load resistor R4, the third-third switching element SW33, the fourth capacitor C4, and the fourth-third switching element SW43. The third-third switching element SW33 and the fourth-third switching element SW43 may be turned on based on the clock signal having the third phase to connect the fourth path PTH4.

In some cases, the third switching unit SWU3 and the fourth switching unit SWU4 may connect the first to fourth paths PTH1, PTH2, PTH3, and PTH4 based on the first to fourth clock signals P1, P2, P3, and P4 having the first to fourth phases. Accordingly, each of the third and fourth input terminals IN3 and IN4 may be connected to the ground GND along the path determined by the clock signal.

The third output terminal OUT3 may be connected to the third input terminal IN3 through the third load resistor R3. The third output terminal OUT3 may be connected to the ground GND through the third switching unit SWU3, the capacitor unit CU, and the fourth switching unit SWU4. The fourth output terminal OUT4 may be connected to the fourth input terminal IN4 through the fourth load resistor R4. The fourth output terminal OUT4 may be connected to the ground GND through the third switching unit SWU3, the capacitor unit CU, and the fourth switching unit SWU4. The third and fourth output terminals OUT3 and OUT4 may correspond to Q-path output terminals.

In some examples, the phases of the frequency signals applied to the first to fourth input terminals IN1, IN2, IN3, and IN4 may be different from each other. The switching elements of the first to fourth switching units SWU1, SWU2, SWU3, and SWU4 may receive the clock signals having the different phases and be connected the first to fourth paths PTH1, PTH2, PTH3, and PTH4.

In FIG. 9, each of the first to fourth capacitors C1, C2, C3, and C4 may have a capacitance of 0.5 pF. The complex bandpass filter 500 may pass a first harmonic component while efficiently removing a third harmonic component and a fifth harmonic component. The complex bandpass filter 500 may remove high-order harmonic components higher than or equal to seventh, ninth and first-first harmonic components (e.g., and realize a high quality factor, thus improving sensitivity and selectivity). The center frequency of the first harmonic component may be, for example, 400 kHz with a gain of 4 dB. The center frequency of the third harmonic component may be, for example, −1.2 MHz with a gain of −15 dB. The center frequency of the fifth harmonic component may be, for example, 2 MHz with a gain of −22 dB. Accordingly, the complex bandpass filter 500 of FIGS. 7 to 9 may remove a noise harmonic component more efficiently than the complex bandpass filter 500 of FIGS. 10 to 12. The complex bandpass filter 500 may not include an OTA for frequency shifting and may implement a complex notch filter using the switching elements, the load resistors, and the capacitors. Since the complex bandpass filter 500 does not include the OTA, the complex bandpass filter 500 may be implemented in a relatively small area with low power consumption. The complex bandpass filter 500 may solve a DC offset problem and may not require an additional tuning circuit for alleviating the change in the frequency characteristic.

Figure 10:
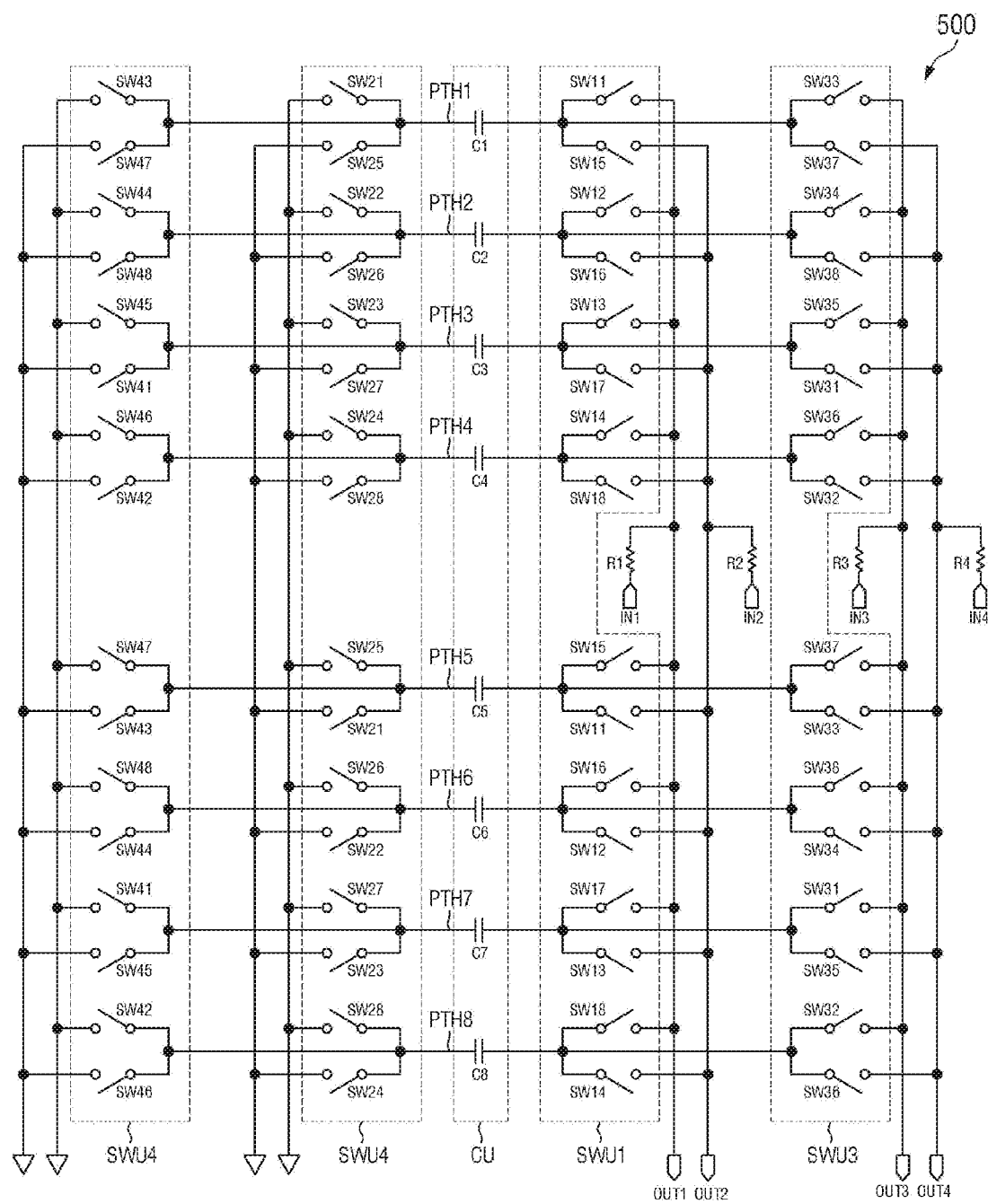
FIG. 10 is a circuit diagram illustrating a complex bandpass filter according to another embodiment.
Figure 11:
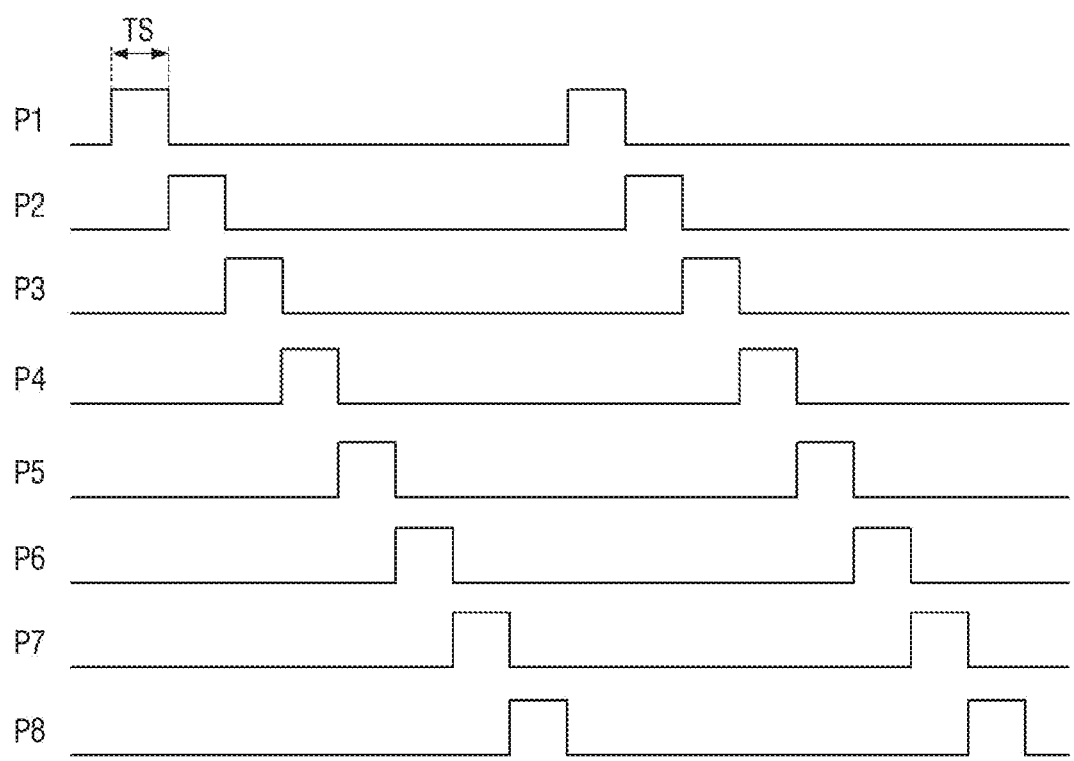
FIG. 11 is a timing diagram illustrating clock signals applied to the complex bandpass filter of FIG. 10.
Figure 12:
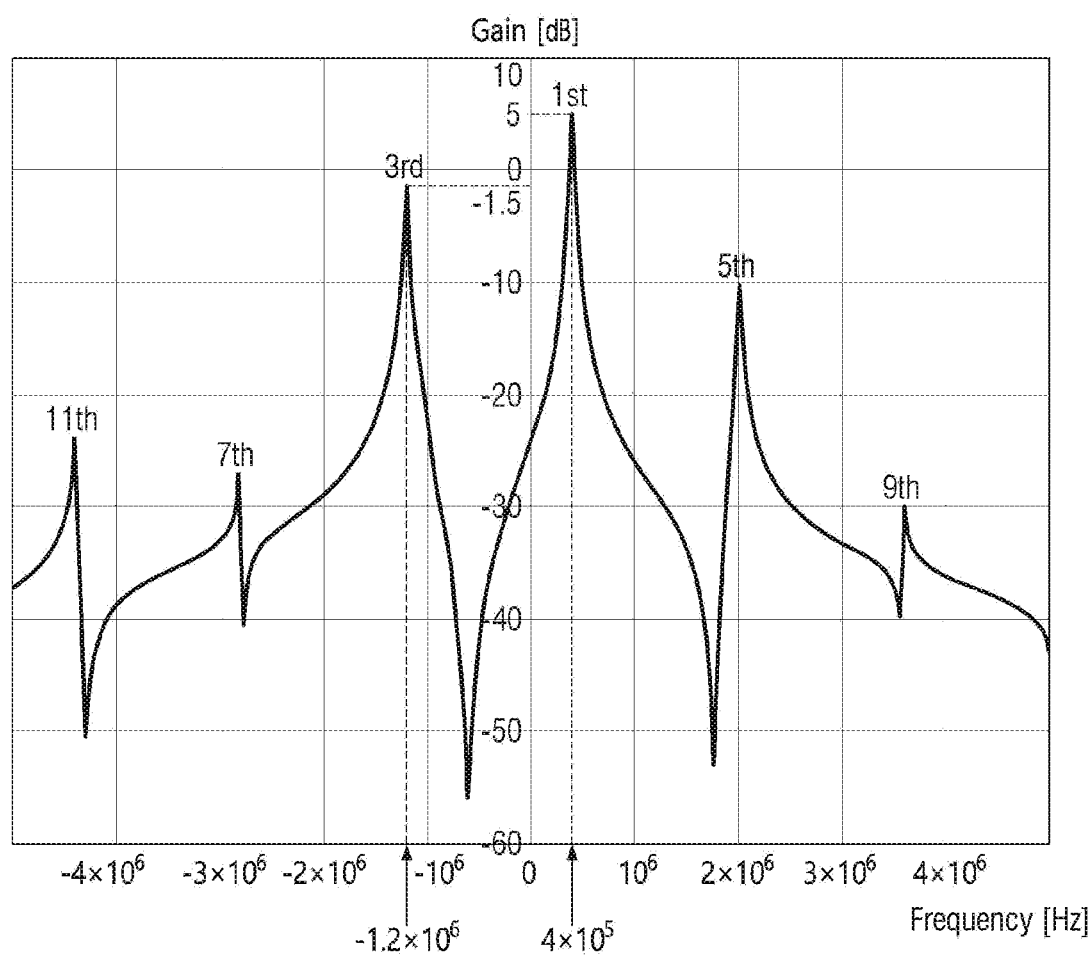
FIG. 12 is a graph showing an output of the complex bandpass filter of FIG. 10.

FIG. 10 is a circuit diagram illustrating a complex bandpass filter according to another embodiment, FIG. 11 is a timing diagram illustrating clock signals applied to the complex bandpass filter of FIG. 10, and FIG. 12 is a graph showing an output of the complex bandpass filter of FIG. 10.

Referring to FIGS. 10 to 12, the complex bandpass filter 500 may include the first to eighth paths PTH1, PTH2, PTH3, PTH4, PTH5, PTH6, PTH7, and PTH8. The complex bandpass filter 500 may sequentially operate the first to eighth paths PTH1, PTH2, PTH3, PTH4, PTH5, PTH6, PTH7, and PTH8 through the first to eighth clock signals P1, P2, P3, P4, P5, P6, P7, and P8 whose phases are sequentially delayed. The first clock signal P1 may have the first phase, and the second clock signal P2 may have the second phase. The third clock signal P3 may have the third phase, and the fourth clock signal P4 may have the fourth phase. The fifth clock signal P5 may have a fifth phase, and the sixth clock signal P6 may have a sixth phase. The seventh clock signal P7 may have a seventh phase, and the eighth clock signal P8 may have an eighth phase. In FIGS. 10 to 12, the second phase and the first phase may have a difference of 45 degrees. The first to eighth clock signals P1, P2, P3, P4, P5, P6, P7, and P8 may have the same pulse width TS, but the present disclosure is not limited thereto.

The complex bandpass filter 500 may include the first to fourth input terminals IN1, IN2, IN3, and IN4, first to fourth load resistors R1, R2, R3 and R4, a first switching unit SWU1, a capacitor unit CU, a second switching unit SWU2, a third switching unit SWU3, a fourth switching unit SWU4, and the first to fourth output terminals OUT1, OUT2, OUT3, and OUT4.

In some examples, the first and second input terminals IN1 and IN2 may correspond to I-path input terminals. Input signals of the first and second input terminals IN1 and IN2 may have opposite phases. The first input terminal IN1 may be connected to the ground GND through the first load resistor R1, the first switching unit SWU1, the capacitor unit CU, and the second switching unit SWU2 that are connected in series. The second input terminal IN2 may be connected to the ground GND through the second load resistor R2, the first switching unit SWU1, the capacitor unit CU, and second switching unit SWU2 that are connected in series. Each of the first and second input terminals IN1 and IN2 may be connected to the ground GND through the first to eighth paths PTH1, PTH2, PTH3, PTH4, PTH5, PTH6, PTH7, and PTH8.

The first switching unit SWU1 may include a first-first switching element SW11, a first-second switching element SW12, a first-third switching element SW13, a first-fourth switching element SW14, a first-fifth switching element SW15, a first-sixth switching element SW16, a first-seventh switching element SW17, and an first-eighth switching element SW18. The capacitor unit CU may include the first capacitor C1, the second capacitor C2, the third capacitor C3, the fourth capacitor C4, the fifth capacitor C5, the sixth capacitor C6, the seventh capacitor C7, and the eighth capacitor C8. The second switching unit SWU2 may include a second-first switching element SW21, a second-second switching element SW22, a second-third switching element SW23, a second-fourth switching element SW24, a second-fifth switching element SW25, a second-sixth switching element SW26, a second-seventh switching element SW27, and a second-eighth switching element SW28. Each of the switching elements of the first and second switching unit SWU1 and SWU2 may be a transistor, for example, but the present disclosure is not limited thereto. Switch-on resistance of one switching element of each of the first switching unit SWU1 and the second switching unit SWU2 may be equivalent to 1 to 10 k Ohm. Accordingly, the magnitude of the switch-on resistance of the first switching unit SWU1 and the second switching unit SWU2 may not affect a frequency characteristic.

The first input terminal IN1 may be connected to the ground GND through the first load resistor R1, the first-first switching element SW11, the first capacitor C1, and the second-first switching element SW21. The first-first switching element SW11 and the second-first switching element SW21 may be turned on based on the first clock signal P1 having the first phase to connect the first path PTH1.

In some cases, the second input terminal IN2 may be connected to the ground GND through the second load resistor R2, the first-fifth switching element SW15, the first capacitor C1, and the second-fifth switching element SW25. The first-fifth switching element SW15 and the second-fifth switching element SW25 may be turned on based on the fifth clock signal P5 having the fifth phase to connect the first path PTH1. The fifth phase may be opposite to the first phase.

The first input terminal IN1 may be connected to the ground GND through the first load resistor R1, the first-second switching element SW12, the second capacitor C2, and the second-second switching element SW22. The first-second switching element SW12 and the second-second switching element SW22 may be turned on based on the second clock signal P2 having the second phase to connect the second path PTH2. The second phase and the first phase may have a difference of 45 degrees. The second phase may be delayed by 45 degrees from the first phase.

The second input terminal IN2 may be connected to the ground GND through the second load resistor R2, the first-sixth switching element SW16, the second capacitor C2, and the second-sixth switching element SW26. The first-sixth switching element SW16 and the second-sixth switching element SW26 may be turned on based on the sixth clock signal P6 having the sixth phase to connect the second path PTH2. The sixth phase may be opposite to the second phase. The sixth phase is, in some examples, delayed by 180 degrees from the second phase.

The first input terminal IN1 may be connected to the ground GND through the first load resistor R1, the first-third switching element SW13, the third capacitor C3, and the second-third switching element SW23. The first-third switching element SW13 and the second-third switching element SW23 may be turned on based on the third clock signal P3 having the third phase to connect the third path PTH3. The third phase and the second phase may have a difference of 45 degrees. The third phase is, in some examples, delayed by 45 degrees from the second phase.

The second input terminal IN2 may be connected to the ground GND through the second load resistor R2, the first-seventh switching element SW17, the third capacitor C3, and the second-seventh switching element SW27. The first-seventh switching element SW17 and the second-seventh switching element SW27 may be turned on based on the seventh clock signal P7 having the seventh phase to connect the third path PTH3. The seventh phase may be opposite to the third phase. The seventh phase is, in some examples, delayed by 180 degrees from the third phase.

The first input terminal IN1 may be connected to the ground GND through the first load resistor R1, the first-fourth switching element SW14, the fourth capacitor C4, and the second-fourth switching element SW24. The first-fourth switching element SW14 and the second-fourth switching element SW24 may be turned on based on the fourth clock signal P4 having the fourth phase to connect the fourth path PTH4. The fourth phase and the third phase may have a difference of 45 degrees. The fourth phase is, in some examples, delayed by 45 degrees from the third phase.

In some embodiments, the second input terminal IN2 may be connected to the ground GND through the second load resistor R2, the first-eighth switching element SW18, the fourth capacitor C4, and the second-eighth switching element SW28. The first-eighth switching element SW18 and the second-eighth switching element SW28 may be turned on based on the eighth clock signal P8 having the eighth phase to connect the fourth path PTH4. The eighth phase may be opposite to the fourth phase. The eighth phase is, in some examples, delayed by 180 degrees from the fourth phase.

The first input terminal IN1 may be connected to the ground GND through the first load resistor R1, the first-fifth switching element SW15, the fifth capacitor C5, and the second-fifth switching element SW25. The first-fifth switching element SW15 and the second-fifth switching element SW25 may be turned on based on the fifth clock signal P5 having the fifth phase to connect the fifth path PTH5. The fifth phase and the fourth phase may have a difference of 45 degrees. The fifth phase is, in some examples, delayed by 45 degrees from the fourth phase.

The second input terminal IN2 may be connected to the ground GND through the second load resistor R2, the first-first switching element SW11, the fifth capacitor C5, and the second-first switching element SW21. The first-first switching element SW11 and the second-first switching element SW21 may be turned on based on the first clock signal P1 having the first phase to connect the fifth path PTH5.

In some examples, the first input terminal IN1 may be connected to the ground GND through the first load resistor R1, the first-sixth switching element SW16, the sixth capacitor C6, and the second-sixth switching element SW26. The first-sixth switching element SW16 and the second-sixth switching element SW26 may be turned on based on the sixth clock signal P6 having the sixth phase to connect the sixth path PTH6. The sixth phase and the fifth phase may have a difference of 45 degrees. The sixth phase is, in some examples, delayed by 45 degrees from the fifth phase.

The second input terminal IN2 may be connected to the ground GND through the second load resistor R2, the first-second switching element SW12, the sixth capacitor C6, and the second-second switching element SW22. The first-second switching element SW12 and the second-second switching element SW22 may be turned on based on the second clock signal P2 having the second phase to connect the sixth path PTH6.

The first input terminal IN1 may be connected to the ground GND through the first load resistor R1, the first-seventh switching element SW17, the seventh capacitor C7, and the second-seventh switching element SW27. The first-seventh switching element SW17 and the second-seventh switching element SW27 may be turned on based on the seventh clock signal P7 having the seventh phase to connect the seventh path PTH7. The seventh phase and the sixth phase may have a difference of 45 degrees. The seventh phase is, in some examples, delayed by 45 degrees from the sixth phase.

The second input terminal IN2 may be connected to the ground GND through the second load resistor R2, the first-third switching element SW13, the seventh capacitor C7, and the second-third switching element SW23. The first-third switching element SW13 and the second-third switching element SW23 may be turned on based on the third clock signal P3 having the third phase to connect the seventh path PTH7.

In some cases, the first input terminal IN1 may be connected to the ground GND through the first load resistor R1, the first-eighth switching element SW18, the eighth capacitor C8, and the second-eighth switching element SW28. The first-eighth switching element SW18 and the second-eighth switching element SW28 may be turned on based on the eighth clock signal P8 having the eighth phase to connect the eighth path PTH8. The eighth phase and the seventh phase may have a difference of 45 degrees. The eighth phase is, in some examples, delayed by 45 degrees from the seventh phase.

The second input terminal IN2 may be connected to the ground GND through the second load resistor R2, the first-fourth switching element SW14, the eighth capacitor C8, and the second-fourth switching element SW24. The first-fourth switching element SW14 and the second-fourth switching element SW24 may be turned on based on the fourth clock signal P4 having the fourth phase to connect the eighth path PTH8.

The first switching unit SWU1 and the second switching unit SWU2 may connect the first to eighth paths PTH1, PTH2, PTH3, PTH4, PTH5, PTH6, PTH7, and PTH8 based on the first to eighth clock signals P1, P2, P3, P4, P5, P6, P7, and P8 having the first to eighth phases. Accordingly, each of the first and second input terminals IN1 and IN2 may be connected to the ground GND along the path determined by the clock signal.

In some embodiments, the first output terminal OUT1 may be connected to the first input terminal IN1 through the first load resistor R1. The first output terminal OUT1 may be connected to the ground GND through the first switching unit SWU1, the capacitor unit CU, and the second switching unit SWU2. The second output terminal OUT2 may be connected to the second input terminal IN2 through the second load resistor R2. The second output terminal OUT2 may be connected to the ground GND through the first switching unit SWU1, the capacitor unit CU, and the second switching unit SWU2. The first and second output terminals OUT1 and OUT2 may correspond to I-path output terminals.

In some cases, the third and fourth input terminals IN3 and IN4 may correspond to Q-path input terminals. Input signals of the third and fourth input terminals IN3 and IN4 may have opposite phases. The third input terminal IN3 may be connected to the ground GND through the third load resistor R3, the third switching unit SWU3, the capacitor unit CU, and the fourth switching unit SWU4 that are connected in series. The fourth input terminal IN4 may be connected to the ground GND through the fourth load resistor R4, the third switching unit SWU3, the capacitor unit CU, and the fourth switching unit SWU4 that are connected in series. Each of the third and fourth input terminals IN3 and IN4 may be connected to the ground GND through the first to eighth paths PTH1, PTH2, PTH3, PTH4, PTH5, PTH6, PTH7, and PTH8.

In some examples, the third switching unit SWU3 may include a third-first switching element SW31, a third-second switching element SW32, a third-third switching element SW33, a third-fourth switching element SW34, a third-fifth switching element SW35, a third-sixth switching element SW36, a third-seventh switching element SW37, and a third-eighth switching element SW38. The fourth switching unit SWU4 may include a fourth-first switching element SW41, a fourth-second switching element SW42, a fourth-third switching element SW43, a fourth-fourth switching element SW44, a fourth-fifth switching element SW45, a fourth-sixth switching element SW46, a fourth-seventh switching element SW47, and a fourth-eighth switching element SW48. Each of the switching elements of the third switching unit SWU3 and the fourth switching unit SWU4 may be a transistor, for example, but the present disclosure is not limited thereto. Switch-on resistance of one switching element of each of the third switching unit SWU3 and the fourth switching unit SWU4 may be equivalent to 1 to 10 k Ohm. Accordingly, the magnitude of the switch-on resistance of the third switching unit SWU3 and the fourth switching unit SWU4 may not affect the frequency characteristic.

The third input terminal IN3 may be connected to the ground GND through the third load resistor R3, the third-third switching element SW33, the first capacitor C1, and the fourth-third switching element SW43. The third-third switching element SW33 and the fourth-third switching element SW43 may be turned on based on the third clock signal P3 having the third phase to connect the first path PTH1.

In some embodiments, the fourth input terminal IN4 may be connected to the ground GND through the fourth load resistor R4, the third-seventh switching element SW37, the first capacitor C1, and the fourth-seventh switching element SW47. The third-seventh switching element SW37 and the fourth-seventh switching element SW47 may be turned on based on the seventh clock signal P7 having the seventh phase to connect the first path PTH1.

The third input terminal IN3 may be connected to the ground GND through the third load resistor R3, the third-fourth switching element SW34, the second capacitor C2, and the fourth-fourth switching element SW44. The third-fourth switching element SW34 and the fourth-fourth switching element SW44 may be turned on based on the fourth clock signal P4 having the fourth phase to connect the second path PTH2.

In some cases, the fourth input terminal IN4 may be connected to the ground GND through the fourth load resistor R4, the third-eighth switching element SW38, the second capacitor C2, and the fourth-eighth switching element SW48. The third-eighth switching element SW38 and the fourth-eighth switching element SW48 may be turned on based on the eighth clock signal P8 having the eighth phase to connect the second path PTH2.

The third input terminal IN3 may be connected to the ground GND through the third load resistor R3, the third-fifth switching element SW35, the third capacitor C3, and the fourth-fifth switching element SW45. The third-fifth switching element SW35 and the fourth-fifth switching element SW45 may be turned on based on the fifth clock signal P5 having the fifth phase to connect the third path PTH3.

In some examples, the fourth input terminal IN4 may be connected to the ground GND through the fourth load resistor R4, the third-first switching element SW31, the third capacitor C3, and the fourth-first switching element SW41. The third-first switching element SW31 and the fourth-first switching element SW41 may be turned on based on the first clock signal P1 having the first phase to connect the third path PTH3.

In some embodiments, the third input terminal IN3 may be connected to the ground GND through the third load resistor R3, the third-sixth switching element SW36, the fourth capacitor C4, and the fourth-sixth switching element SW46. The third-sixth switching element SW36 and the fourth-sixth switching element SW46 may be turned on based on the sixth clock signal P6 having the sixth phase to connect the fourth path PTH4.

The fourth input terminal IN4 may be connected to the ground GND through the fourth load resistor R4, the third-second switching element SW32, the fourth capacitor C4, and the fourth-second switching element SW42. The third-second switching element SW32 and the fourth-second switching element SW42 may be turned on based on the second clock signal P2 having the second phase to connect the fourth path PTH3.

In some cases, the third input terminal IN3 may be connected to the ground GND through the third load resistor R3, the third-seventh switching element SW37, the fifth capacitor C5, and the fourth-seventh switching element SW47. The third-seventh switching element SW37 and the fourth-seventh switching element SW47 may be turned on based on the seventh clock signal P7 having the seventh phase to connect the fifth path PTH5.

The fourth input terminal IN4 may be connected to the ground GND through the fourth load resistor R4, the third-third switching element SW33, the fifth capacitor C5, and the fourth-third switching element SW43. The third-third switching element SW33 and the fourth-third switching element SW43 may be turned on based on the third clock signal P3 having the third phase to connect the fifth path PTH5.

In some examples, the third input terminal IN3 may be connected to the ground GND through the third load resistor R3, the third-eighth switching element SW38, the sixth capacitor C6, and the fourth-eighth switching element SW48. The third-eighth switching element SW38 and the fourth-eighth switching element SW48 may be turned on based on the eighth clock signal P8 having the eighth phase to connect the sixth path PTH6.

In some examples, the fourth input terminal IN4 may be connected to the ground GND through the fourth load resistor R4, the third-fourth switching element SW34, the sixth capacitor C6, and the fourth-fourth switching element SW44. The third-fourth switching element SW34 and the fourth-fourth switching element SW46 may be turned on based on the fourth clock signal P4 having the fourth phase to connect the sixth path PTH6.

The third input terminal IN3 may be connected to the ground GND through the third load resistor R3, the third-first switching element SW31, the seventh capacitor C7, and the fourth-first switching element SW41. The third-first switching element SW31 and the fourth-first switching element SW41 may be turned on based on the first clock signal P1 having the first phase to connect the seventh path PTH7.

The fourth input terminal IN4 may be connected to the ground GND through the fourth load resistor R4, the third-fifth switching element SW35, the seventh capacitor C7, and the fourth-fifth switching element SW45. The third-fifth switching element SW35 and the fourth-fifth switching element SW45 may be turned on based on the fifth clock signal P5 having the fifth phase to connect the seventh path PTH7.

The third input terminal IN3 may be connected to the ground GND through the third load resistor R3, the third-second switching element SW32, the eighth capacitor C8, and the fourth-second switching element SW42. The third-second switching element SW32 and the fourth-second switching element SW42 may be turned on based on the second clock signal P2 having the second phase to connect the eighth path PTH8.

The fourth input terminal IN4 may be connected to the ground GND through the fourth load resistor R4, the third-sixth switching element SW36, the eighth capacitor C8, and the fourth-sixth switching element SW46. The third-sixth switching element SW36 and the fourth-sixth switching element SW46 may be turned on based on the sixth clock signal P6 having the sixth phase to connect the eighth path PTH8.

In some cases, the third switching unit SWU3 and the fourth switching unit SWU4 may connect the first to eighth paths PTH1, PTH2, PTH3, PTH4, PTH5, PTH6, PTH7, and PTH8 based on the first to eighth clock signals P1, P2, P3, P4, P5, P6, P7, and P8 having the first to eighth phases. Accordingly, each of the third and fourth input terminals IN3 and IN4 may be connected to the ground GND along the path determined by the clock signal.

In some embodiments, the third output terminal OUT3 may be connected to the third input terminal IN3 through the third load resistor R3. The third output terminal OUT3 may be connected to the ground GND through the third switching unit SWU3, the capacitor unit CU, and the fourth switching unit SWU4. The fourth output terminal OUT4 may be connected to the fourth input terminal IN4 through the fourth load resistor R4. The fourth output terminal OUT4 may be connected to the ground GND through the third switching unit SWU3, the capacitor unit CU, and the fourth switching unit SWU4. The third and fourth output terminals OUT3 and OUT4 may correspond to Q-path output terminals.

The phases of the frequency signals applied to the first to fourth input terminals IN1, IN2, IN3, and IN4 may be different from each other. The switching elements of the first to fourth switching units SWU1, SWU2, SWU3, and SWU4 may receive the clock signals having the different phases and be connected the first to fourth paths PTH1, PTH2, PTH3, and PTH4.

In FIG. 12, each of the first to eighth capacitors C1, C2, C3, C4, C5, C6, C7, and C8 may have a capacitance of 0.5 pF. The complex bandpass filter 500 may pass the first harmonic component. The center frequency of the first harmonic component is, in some examples, 400 kHz with a gain of 5 dB. The center frequency of the third harmonic component is, in some examples, −1.2 MHz with a gain of −1.5 dB. The center frequency of the fifth harmonic component is, in some examples, 2 MHz with a gain of −10 dB. Accordingly, the complex bandpass filter 500 of FIGS. 10 to 12 has a higher quality factor (Q-factor) than the complex bandpass filter 500 of FIGS. 7 to 9, thus being able to improve sensitivity and selectivity as well as fidelity over a wide band. The complex bandpass filter 500 may not include an OTA for frequency shifting and may implement a complex notch filter using the switching elements, the load resistors, and the capacitors. Since the complex bandpass filter 500 does not include the OTA, it may be implemented in a relatively small area with low power consumption. The complex bandpass filter 500 may solve a DC offset problem and may not require an additional tuning circuit for alleviating the change in the frequency characteristic.

What is claimed is:
1. A bandpass filter comprising:
a first input terminal and a second input terminal, the first input terminal configured to receive a first radio frequency signal having a first phase and the second input terminal configured to receive a second radio frequency signal having a second phase different from the first phase;
a first load resistor connected in series to the first input terminal;
a second load resistor connected in series to the second input terminal;
a first switching unit connected in series to the first load resistor and the second load resistor;
a capacitor unit connected in series to the first switching unit;

a second switching unit connected between the capacitor unit and a ground;
a first output terminal connected between the first switching unit and the first load resistor; and
a second output terminal connected between the first switching unit and the second load resistor.

2. The bandpass filter of claim 1, wherein:
the first switching unit and the second switching unit are turned on based on clock signals having the same phase to connect the first load resistor and the capacitor unit in series to the ground or to connect the second load resistor and the capacitor unit in series to the ground.

3. The bandpass filter of claim 2, wherein:
one switching element of the first switching unit and one switching element of the second switching unit are turned on based on a clock signal having the first phase and are connected to one capacitor of the capacitor unit; and
another switching element of the first switching unit and another switching element of the second switching unit are turned on based on the clock signal having the first phase and are connected to another capacitor of the capacitor unit.

4. The bandpass filter of claim 1, wherein the first switching unit comprises:
at least one first-first switching element turned on based on a first clock signal having a first phase;
at least one first-second switching element turned on based on a second clock signal having the second phase delayed from the first phase;
at least one first-third switching element turned on based on a third clock signal having a third phase delayed from the second phase; and
at least one first-fourth switching element turned on based on a fourth clock signal having a fourth phase delayed from the third phase.

5. The bandpass filter of claim 4, wherein the capacitor unit comprises:
a first capacitor connected to the first load resistor through the at least one first-first switching element, and the first capacitor is connected to the second load resistor through the at least one first-third switching element;
a second capacitor connected to the first load resistor through the at least one first-second switching element, and the second capacitor is connected to the second load resistor through the at least one first-fourth switching element;
a third capacitor connected to the first load resistor through the at least one first-third switching element, and the third capacitor is connected to the second load resistor through the at least one first-first switching element; and
a fourth capacitor connected to the first load resistor through the at least one first-fourth switching element, and the fourth capacitor is connected to the second load resistor through the at least one first-second switching element.

6. The bandpass filter of claim 5, wherein the second switching unit comprises:
at least one second-first switching element turned on based on the first clock signal having the first phase;
at least one second-second switching element turned on based on the second clock signal having the second phase delayed from the first phase;
at least one second-third switching element turned on based on the third clock signal having the third phase delayed from the second phase; and
at least one second-fourth switching element turned on based on the fourth clock signal having the fourth phase delayed from the third phase.

7. The bandpass filter of claim 6, wherein:
the first capacitor is connected to the ground through the second-first switching element or the second-third switching element;
the second capacitor is connected to the ground through the second-second switching element or the second-fourth switching element;
the third capacitor is connected to the ground through the second-third switching element or the second-first switching element; and
the fourth capacitor is connected to the ground through the second-fourth switching element or the second-second switching element.

8. The bandpass filter of claim 6, further comprising:
a third input terminal and a fourth input terminal configured to receive a plurality of radio frequency signals having a phase different from those of the radio frequency signals of the first and second input terminals;
a third load resistor connected to the third input terminal;
a fourth load resistor connected to the fourth input terminal;
a third switching unit connected between the third load resistor and the capacitor unit or between the fourth load resistor and the capacitor unit;
a fourth switching unit connected between the capacitor unit and the ground;
a third output terminal connected between the third switching unit and the third load resistor; and
a fourth output terminal connected between the third switching unit and the fourth load resistor.

9. The bandpass filter of claim 8, wherein the third switching unit comprises:
at least one third-first switching element turned on based on the first clock signal having the first phase;
at least one third-second switching element turned on based on the second clock signal having the second phase delayed from the first phase;
at least one third-third switching element turned on based on the third clock signal having the third phase delayed from the second phase; and
at least one third-fourth switching element turned on based on the fourth clock signal having the fourth phase delayed from the third phase.

10. The bandpass filter of claim 9, wherein the fourth switching unit comprises:
at least one fourth-first switching element turned on based on the first clock signal having the first phase;
at least one fourth-second switching element turned on based on the second clock signal having the second phase delayed from the first phase;
at least one fourth-third switching element turned on based on the third clock signal having the third phase delayed from the second phase; and
at least one fourth-fourth switching element turned on based on the fourth clock signal having the fourth phase delayed from the third phase.

11. The bandpass filter of claim 10, wherein:
the first capacitor is connected to the third load resistor through the third-second switching element, and the first capacitor is connected to the fourth load resistor through the third-fourth switching element;
the second capacitor is connected to the third load resistor through the third-third switching element, and the second capacitor is connected to the fourth load resistor through the third-first switching element;

the third capacitor is connected to the third load resistor through the third-fourth switching element, and the third capacitor is connected to the fourth load resistor through the third-second switching element; and the fourth capacitor is connected to the third load resistor through the third-first switching element, and the fourth capacitor is connected to the fourth load resistor through the third-third switching element.

12. The bandpass filter of claim 10, wherein:

the first capacitor is connected to the ground through the fourth-second switching element or the fourth-fourth switching element;

the second capacitor is connected to the ground through the fourth-third switching element or the fourth-first switching element;

the third capacitor is connected to the ground through the fourth-fourth switching element or the fourth-second switching element; and the fourth capacitor is connected to the ground through the fourth-first switching element or the fourth-third switching element.

13. The bandpass filter of claim 1, wherein the first switching unit comprises:

at least one first-first switching element turned on based on a first clock signal having a first phase;

at least one first-second switching element turned on based on a second clock signal having a second phase delayed from the first phase;

at least one first-third switching element turned on based on a third clock signal having a third phase delayed from the second phase;

at least one first-fourth switching element turned on based on a fourth clock signal having a fourth phase delayed from the third phase;

at least one first-fifth switching element turned on based on a fifth clock signal having a fifth phase delayed from the fourth phase;

at least one first-sixth switching element turned on based on a sixth clock signal having a sixth phase delayed from the fifth phase;

at least one first-seventh switching element turned on based on a seventh clock signal having a seventh phase delayed from the sixth phase; and at least one first-eighth switching element turned on based on an eighth clock signal having an eighth phase delayed from the seventh phase.

14. The bandpass filter of claim 13, wherein the capacitor unit comprises:

a first capacitor connected to the first load resistor through the at least one first-first switching element, and the first capacitor is connected to the second load resistor through the at least one first-fifth switching element;

a second capacitor connected to the first load resistor through the at least one first-second switching element, and the second capacitor is connected to the second load resistor through the at least one first-sixth switching element;

a third capacitor connected to the first load resistor through the at least one first-third switching element, and the third capacitor is connected to the second load resistor through the at least one first-seventh switching element;

a fourth capacitor connected to the first load resistor through the at least one first-fourth switching element, and the fourth capacitor is connected to the second load resistor through the at least one first-eighth switching element;

a fifth capacitor connected to the first load resistor through the at least one first-fifth switching element, and the fifth capacitor is connected to the second load resistor through the at least one first-first switching element;

a sixth capacitor connected to the first load resistor through the at least one first-sixth switching element, and the sixth capacitor is connected to the second load resistor through the at least one first-second switching element;

a seventh capacitor connected to the first load resistor through the at least one first-seventh switching element, and the seventh capacitor is connected to the second load resistor through the at least one first-third switching element; and an eighth capacitor connected to the first load resistor through the at least one first-eighth switching element, and the eighth capacitor is connected to the second load resistor through the at least one first-fourth switching element.

15. The bandpass filter of claim 14, wherein the second switching unit comprises:

at least one second-first switching element turned on based on the first clock signal having the first phase;

at least one second-second switching element turned on based on the second clock signal having the second phase delayed from the first phase;

at least one second-third switching element turned on based on the third clock signal having the third phase delayed from the second phase;

at least one second-fourth switching element turned on based on the fourth clock signal having the fourth phase delayed from the third phase;

at least one second-fifth switching element turned on based on the fifth clock signal having the fifth phase delayed from the fourth phase;

at least one second-sixth switching element turned on based on the sixth clock signal having the sixth phase delayed from the fifth phase;

at least one second-seventh switching element turned on based on the seventh clock signal having the seventh phase delayed from the sixth phase; and at least one second-eighth switching element turned on based on the eighth clock signal having the eighth phase delayed from the seventh phase.

16. The bandpass filter of claim 15, further comprising:

third and fourth input terminals configured to receive a second plurality of radio frequency signals having a second phase difference different from the phase difference of the plurality of radio frequency signals the first and second input terminals are configured to receive;

a third load resistor connected to the third input terminal;

a fourth load resistor connected to the fourth input terminal;

a third switching unit connected between the third load resistor and the capacitor unit or between the fourth load resistor and the capacitor unit;

a fourth switching unit connected between the capacitor unit and the ground;

a third output terminals connected between the third switching unit and the third load resistor; and a fourth output terminal connected between the third switching unit and the fourth load resistor.

17. A bandpass filter comprising:
first input terminal configured to receive a first radio frequency signal having a first phase and second input terminal configured to receive a second radio frequency signal having a second phase different from the first phase;
a first load resistor connected in series to the first input terminal;
a second load resistor connected in series to the second input terminal;
a first switching unit configured to connect the first load resistor or the second load resistor to each of a plurality of paths;
a capacitor unit disposed on each of the plurality of paths and connected to the first switching unit; and
a second switching unit disposed on each of the plurality of paths and connected between the capacitor unit and a ground.

18. The bandpass filter of claim 17, further comprising:
a first output terminal connected between the first switching unit and the first load resistor; and
a second output terminal connected between the first switching unit and the second load resistor.

19. The bandpass filter of claim 17, wherein:
a switching element of the first switching unit and a switching element of the second switching unit disposed on one path among the plurality of paths are turned on based on clock signals having the same phase to connect the first load resistor and the capacitor unit in series to the ground or to connect the second load resistor and the capacitor unit in series to the ground.

20. A touch driver comprising:
a bandpass filter configured to receive a radio frequency signal and filter a specific frequency band;
a first mixer configured to receive an output of the bandpass filter and output frequency signals having a first phase and a second phase opposite to the first phase;
a second mixer configured to receive an output of the bandpass filter and output frequency signals having a third phase different from the first phase and a fourth phase opposite to the third phase; and
a complex bandpass filter configured to receive outputs of the first and second mixers and select and output one of a positive frequency component and a negative frequency component,
wherein the complex bandpass filter comprises:
a first input terminal and a second input terminal, the first input terminal and the second input terminal configured to receive a plurality of radio frequency signals having a phase difference;
a first load resistor connected in series to the first input terminal;
a second load resistor connected in series to the second input terminal;
a first switching unit connected in series to the first load resistor and the second load resistor;
a capacitor unit connected in series to the first switching unit;
a second switching unit connected between the capacitor unit and a ground;
a first output terminal connected between the first switching unit and the first load resistor; and
a second output terminal connected between the first switching unit and the second load resistor.

21. A method comprising:
receiving a plurality of radio frequency signals using at least two input terminals including a first input terminal configured to receive a positive frequency component having a first phase and a second input terminal configured to receive a negative frequency component having a second phase opposite to the first phase;
selecting one of the positive frequency component and the negative frequency component using a circuit comprising:
at least two load resistors connected in series to the at least two input terminals;
a first switching unit connected in series to the at least two load resistors;
a capacitor unit connected in series to the first switching unit;
a second switching unit connected between the capacitor unit and a ground; and
outputting the selected one of the positive frequency component and the negative frequency component using at least two output terminals, the at least two output terminals connected between the first switching unit and the at least two load resistors.

* * * * *